(12) United States Patent
Iwai

(10) Patent No.: US 8,642,243 B2
(45) Date of Patent: *Feb. 4, 2014

(54) POLYMERIZABLE COMPOSITION, AND LITHOGRAPHIC PRINTING PLATE PRECURSOR, ANTIFOULING MEMBER AND ANTIFOGGING MEMBER EACH USING THE SAME

(75) Inventor: Yu Iwai, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 97 days.

This patent is subject to a terminal disclaimer.

(21) Appl. No.: 13/221,534

(22) Filed: Aug. 30, 2011

(65) Prior Publication Data

US 2012/0052444 A1    Mar. 1, 2012

(30) Foreign Application Priority Data

Aug. 31, 2010 (JP) ................ P2010-195226

(51) Int. Cl.
*G03F 7/00*  (2006.01)
*G03F 7/004*  (2006.01)
*G03F 7/028*  (2006.01)

(52) U.S. Cl.
USPC .......... 430/270.1; 430/281.1; 430/286.1; 430/302; 430/913

(58) Field of Classification Search
USPC .......... 430/270.1, 281.1, 286.1, 302, 913
See application file for complete search history.

(56) References Cited

U.S. PATENT DOCUMENTS

| | | | |
|---|---|---|---|
| 7,063,936 B2 * | 6/2006 | Kakino et al. | 430/287.1 |
| 7,300,740 B2 * | 11/2007 | Yamasaki et al. | 430/270.1 |
| 7,618,762 B2 * | 11/2009 | Kunita et al. | 430/138 |
| 2002/0177074 A1 | 11/2002 | Hoshi et al. | |
| 2005/0266349 A1 | 12/2005 | Van Damme et al. | |
| 2006/0057492 A1 | 3/2006 | Kunita et al. | |
| 2008/0318155 A1 * | 12/2008 | Suzuki et al. | 430/270.1 |
| 2009/0047601 A1 | 2/2009 | Iwai et al. | |
| 2011/0217656 A1 * | 9/2011 | Taguchi et al. | 430/270.1 |

FOREIGN PATENT DOCUMENTS

| | | |
|---|---|---|
| EP | 1 868 036 A1 | 12/2007 |
| JP | 2002-287334 A | 10/2002 |
| JP | 2005125749 A * | 5/2005 |
| JP | 2006-111860 A | 4/2006 |
| JP | 2006111860 A * | 4/2006 |
| JP | 2007139840 A * | 6/2007 |
| JP | 2008213177 A * | 9/2008 |
| JP | 2009-29124 A | 2/2009 |
| JP | 2010083028 A * | 4/2010 |
| WO | WO 2005/111727 A1 | 11/2005 |

OTHER PUBLICATIONS

Machine translation of JP2007-139840 (no date).*
Machine translation of JP 2006-111860 (no date).*

* cited by examiner

*Primary Examiner* — Amanda C. Walke
(74) *Attorney, Agent, or Firm* — Birch, Stewart, Kolasch & Birch, LLP

(57) ABSTRACT

A polymerizable composition contains: (A) a polymer compound having (a1) a repeating unit having a structure represented by the following formula (a1-1) in a side chain thereof; and (B) a polymerization initiator, $$*-Y^1-N(R^{11})-C(=O)-N(R^{12})-L^1-C(R^{13})=C(R^{14})(R^{15})$$

(a1-1)

and in the formula (a1-1), $R^{11}$ and $R^{12}$ each independently represents a hydrogen atom, an alkyl group, an aryl group, a heterocyclic group, a sulfo group, an alkylsulfonyl group, a arylsulfonyl group, an acyl group, an aryloxycarbonyl group, an alkoxycarbonyl group or a carbamoyl group, $R^{13}$, $R^{14}$ and $R^{15}$ each independently represents a hydrogen atom, an alkyl group or an aryl group, $L^1$ represents a divalent connecting group, $Y^1$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

10 Claims, No Drawings

POLYMERIZABLE COMPOSITION, AND LITHOGRAPHIC PRINTING PLATE PRECURSOR, ANTIFOULING MEMBER AND ANTIFOGGING MEMBER EACH USING THE SAME

FIELD OF THE INVENTION

The present invention relates to a polymerizable composition, and a lithographic printing plate precursor, an antifouling member and an antifogging member each using the same.

BACKGROUND OF THE INVENTION

It is ordinarily known to use a polymer compound having an ethylenically unsaturated double bond in a polymerizable composition in order to increase a crosslinking property. The increase in crosslinking density of the polymerizable composition is the most important technique in the field of using polymerizable composition.

For instance, in the case of using the polymerizable composition in the use requiring development processing, for example, with an aqueous solution or in the use where hydrophilicity of a cured film functions, it is needed to introduce a hydrophilic component into the polymerizable composition, and it is necessary for the polymerized cured film to have a high crosslinking density in order to fulfill requirement, for example, durability in water or nonswellability.

An example of material using such a polymerizable composition includes a lithographic printing plate precursor.

The lithographic printing plate precursor comprises an oleophilic image-recording layer provided on a hydrophilic support and is used to obtain a lithographic printing plate by a process including imagewise exposure with laser and then development processing, for example, with an alkaline developer to remove the unnecessary image-recording layer corresponding to the non-image area by dissolving while leaving the image-recording layer corresponding to the image area.

In view of response to a global environmental problem, simplification or elimination of the development processing has been pursued. As one method for simplification of the development processing, a method referred to as an "on-press development" is practiced. Specifically, according to the method after exposure of a lithographic printing plate precursor, the lithographic printing plate precursor is mounted as it is on a printing machine without conducting conventional development processing and removal of the unnecessary area of image-recording layer is performed with dampening water and/or ink at an early stage of printing step. Also, as a method of simple development, a method referred to as a "gum development" is practiced wherein the removal of the unnecessary area of image-recording layer is performed using not a conventional highly alkaline developer but a finisher or gum solution having pH close to neutral.

In the simplification of plate making operation as described above, a system using a lithographic printing plate precursor capable of being handled in a bright room or under a yellow lump and a light source is preferred from the standpoint of workability. Thus, as the light source, a semiconductor laser emitting an infrared ray having a wavelength of 760 to 1,200 or a solid laser, for example, YAG laser, is used. An UV laser can also be used.

As the lithographic printing plate precursor capable of undergoing on-press development, for instance, a lithographic printing plate precursor having provided on a support, an image-recording layer (photosensitive layer) containing an infrared absorbing agent, a radical polymerization initiator and a polymerizable compound is described in JP-A-2002-287334 (the term "JP-A" as used herein means an "unexamined published Japanese patent application"). Also, as the lithographic printing plate precursor capable of undergoing gum development, for instance, a lithographic printing plate precursor wherein the development is conducted with a finisher or a gum solution having pH close to neutral is known as described in EP-A-1751625 or EP-A-1868036.

In such a lithographic printing plate precursor of a simple processing type, an image-recording layer having a high hydrophilicity is used in order to make possible development with a developer having pH close to neutral or dampening water on a printing machine and as a result, strength of the image area becomes weak with dampening water during printing to cause a problem in that sufficient printing durability can not be obtained.

In view of the above problems, in JP-A-2006-111860 or JP-A-2009-29124, a lithographic printing plate precursor capable of undergoing on-press development having an image-recording layer comprising a laser-sensitive polymerizable composition containing a polymer compound having a radical polymerizable group is proposed. However, the radical polymerizable group described in JP-A-2006-111860 or JP-A-2009-29124 does not achieve sufficient printing durability. Further, the polymer compound is still insufficient in the developing property in the simple processing.

SUMMARY OF THE INVENTION

An object of the present invention is to provide a polymerizable composition which can provide a higher crosslinking density. Another object of the invention is to provide a polymerizable composition which can provide a higher crosslinking density and hydrophilicity. A still another object of the invention is to provide a lithographic printing plate which is excellent in printing durability and a lithographic printing plate precursor which is excellent in on-press development property by using the polymerizable composition. A further object of the invention is to provide a member which is excellent in antifouling property and antifogging property by utilizing the excellent hydrophilicity and film strength which are the features of the polymerizable composition.

The present invention includes the following items.

(1) A polymerizable composition containing (A) a polymer compound containing (a1) a repeating unit having a structure represented by formula (a1-1) shown below in its side chain and (B) a polymerization initiator:

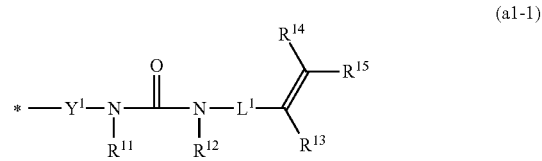

(a1-1)

In formula (a1-1), $R^{11}$ and $R^{12}$ each independently represents a hydrogen atom, an alkyl group, an aryl group, a heterocyclic group, a sulfo group, an alkylsulfonyl group, a arylsulfonyl group, an acyl group, an aryloxycarbonyl group, an alkoxycarbonyl group or a carbamoyl group, $R^{13}$, $R^{14}$ and $R^{15}$ each independently represents a hydrogen atom, an alkyl group or an aryl group, $L^1$ represents a divalent connecting group, $Y^1$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

(2) The polymerizable composition as described in (1) above, wherein the polymer compound (A) further contains (a2) a repeating unit having a zwitter ion structure represented by formula (a2-1) or (a2-2) shown below in its side chain:

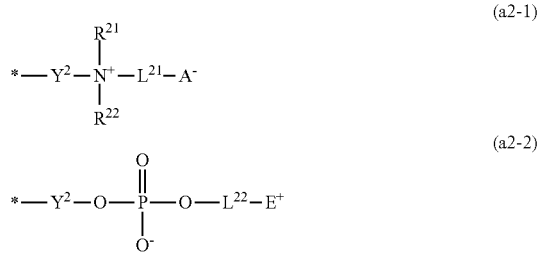

In formula (a2-1), $R^{21}$ and $R^{22}$ each independently represents a hydrogen atom, an alkyl group, an alkenyl group, an alkynyl group, an aryl group or a heterocyclic group, or $R^{21}$ and $R^{22}$ may be combined with each other to from a ring structure, $L^{21}$ represents a divalent connecting group, $A^-$ represents a structure having an anion, $Y^2$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound. In formula (a2-2), $L^{22}$ represents a divalent connecting group, $E^+$ represents a structure having a cation, $Y^2$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

(3) The polymerizable composition as described in (1) or (2) above, wherein the side chain having a zwitter ion structure in the repeating unit (a2) has a structure represented by formula (a2-1) and in formula (a2-1), $A^-$ represents a sulfonate.

(4) A lithographic printing plate precursor comprising on a support an image-recording layer containing the polymerizable composition as described in any one of (1) to (3) above.

(5) The lithographic printing plate precursor as described in (4) above, wherein the image-recording layer is capable of being removed with at least any of printing ink and dampening water.

(6) An antifouling member obtaining by curing the polymerizable composition as described in (2) or (3) above.

(7) An antifogging member obtaining by curing the polymerizable composition as described in (2) or (3) above.

It is estimated that the effects of the invention may occur for the following reasons.

It is believed that due to a hydrogen bond derived from the urea structure in the polymer compound having the structure represented by formula (a1-1) in its side chain, the radical polymerizable ethylenically unsaturated bonds of the polymer compound are positioned closely each other and when a radical is generated from a polymerization initiator, the radical polymerization proceeds with high efficiency to form a strong three-dimensional crosslinked film.

Further, since the strong three-dimensional crosslinked film can be formed even when the zwitter ion structure having high hydrophilicity is introduced into the side chain, it is possible to provide a lithographic printing plate which is excellent in printing durability and a lithographic printing plate precursor which is excellent in on-press development property.

Moreover, since the crosslinked film is hardly swellable in water, an antifouling member or antifogging member which is excellent in abrasion resistance can be provided.

According to the present invention, a polymerizable composition capable of forming a strong three-dimensional crosslinkage by radical polymerization and a lithographic printing plate precursor which is excellent in developing property and printing durability, particularly, a lithographic printing plate precursor which is capable of conducting a so-called direct plate making, in which the plate making is directly conducted based on digital signals, for example, from a computer using various kinds of lasers and exhibits high productivity, can be rapidly developed by on-press development, and can provide a lithographic printing plate exhibiting high printing durability can be provided.

Also, a hydrophilic member which is excellent in antifouling property and antifogging property on the surface of substrate can be provided.

DETAILED DESCRIPTION OF THE INVENTION

The present invention will be described in detail below.
[Polymerizable Composition]
The polymerizable composition according to the invention comprises (A) a polymer compound (hereinafter, also referred to as a "specific polymer compound") containing (a1) a repeating unit having a structure represented by formula (a1-1) shown below in its side chain and (B) a polymerization initiator.

The specific polymer compound, polymerization initiator and other elements are described in detail below.
<(A) Specific Polymer Compound>
(a1) Repeating Unit Having Structure Represented by Formula (a1-1) in its Side Chain
The specific polymer compound according to the invention contains the repeating unit having a structure represented by formula (a1-1) shown below in its side chain.

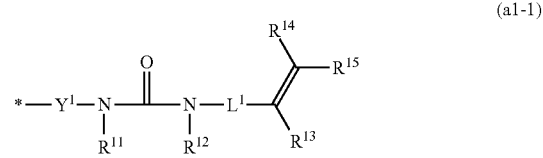

In formula (a1-1), $R^{11}$ and $R^{12}$ each independently represents a hydrogen atom, an alkyl group, an aryl group, a heterocyclic group, a sulfo group, an alkylsulfonyl group, a arylsulfonyl group, an acyl group, an aryloxycarbonyl group, an alkoxycarbonyl group or a carbamoyl group, $R^{13}$, $R^{14}$ and $R^{15}$ each independently represents a hydrogen atom, an alkyl group or an aryl group, L' represents a divalent connecting group, $Y^1$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

More specifically, the alkyl group represented by $R^{11}$ and $R^{12}$ may be any of straight-chain, branched and cyclic, substituted or unsubstituted alkyl group. The alkyl group includes a straight-chain or branched alkyl group (preferably a substituted or unsubstituted alkyl group having from 1 to 30 carbon atoms, for example, a methyl group, an ethyl group, a n-propyl group, an isopropyl group, a tert-butyl group, a n-octyl group, an eicosyl group, a 2-chloroethyl group, a 2-cyanoethyl group or a 2-ethylhexyl group), a cycloalkyl group (preferably a substituted or unsubstituted cycloalkyl group having from 3 to 30 carbon atoms, for example, a cyclohexyl group, a cyclopentyl group or a 4-n-dodecylcyclohexyl group), a bicycloalkyl group (preferably a substituted or unsubstituted bicycloalkyl group having from 5 to 30 carbon atoms, that is, a monovalent group formed by eliminating one hydrogen atom from a bicycloalkane having from 5 to 30 carbon atoms, for example, a bicycle[1,2,2]heptan-2-yl group or a bicycle[2,2,2]octan-3-yl group), and a cycloalkyl group having more cyclic structures, for example, a tricycle structure. The alkyl group included in the substituent described hereinafter (for example, the alkyl group in the alkylthio group) also has the same meaning as described above.

The aryl group represented by $R^{11}$ and $R^{12}$ preferably represents a substituted or unsubstituted aryl group having from 6 to 30 carbon atoms, for example, a phenyl group, a p-tolyl group, a naphthyl group, a m-chlorophenyl group or an o-hexadecanoylaminophenyl group). The heterocyclic group represented by $R^{11}$ and $R^{12}$ is preferably a monovalent group formed by eliminating one hydrogen atom from a 5-membered or 6-membered, substituted or unsubstituted, aromatic or non-aromatic heterocyclic compound, more preferably a 5-membered or 6-membered aromatic heterocyclic group having from 3 to 30 carbon atoms. For example, a 2-furyl group, a 2-thienyl group, a 2-pyrimidinyl or a 2-benzothiazolyl group is exemplified. The alkylsulfonyl group represented by $R^{11}$ and $R^{12}$ is preferably a substituted or unsubstituted alkylsulfonyl group having from 1 to 30 carbon atoms and the arylsulfonyl group represented by $R^{11}$ and $R^{12}$ is preferably a substituted or unsubstituted arylsulfonyl group having from 6 to 30 carbon atoms. For example, a methylsulfonyl group, an ethylsulfonyl group, a phenylsulfonyl group or a p-methylphenylsulfonyl group is exemplified. The acyl group represented by $R^{11}$ and $R^{12}$ is preferably a formyl group, a substituted or unsubstituted alkylcarbonyl group having from 1 to 30 carbon atoms, a substituted or unsubstituted arylcarbonyl group having from 7 to 30 carbon atoms, or a substituted or unsubstituted heterocyclic carbonyl group having from 4 to 30 carbon atoms in which the heterocyclic group is connected to the carbonyl group with its carbon atom. For example, an acetyl group, a pivaloyl group, a 2-chloroacetyl group, a stearoyl group, a benzoyl group, a p-n-octyloxyphenylcarbonyl group, a 2-pyridylcarbonyl or a 2-furylcarbonyl group is exemplified. The aryloxycarbonyl group represented by $R^{11}$ and $R^{12}$ is preferably a substituted or unsubstituted aryloxycarbonyl group having from 7 to 30 carbon atoms. For example, a phenoxycarbonyl group, an o-chlorophenoxycarbonyl group, m-nitrophenoxycarbonyl group or a p-tert-butylphenoxycarbonyl group is exemplified. An alkoxycarbonyl group represented by $R^{11}$ and $R^{12}$ is preferably a substituted or unsubstituted alkoxycarbonyl group having from 2 to 30 carbon atoms. For example, a methoxycarbonyl group, an ethoxycarbonyl group, a tert-butoxycarbonyl group or a n-octadecyloxycarbonyl group is exemplified. A carbamoyl group represented by $R^{11}$ and $R^{12}$ is preferably a substituted or unsubstituted carbamoyl group having from 1 to 30 carbon atoms. For example, a carbamoyl group, an N-methylcarbamoyl group, an N,N-dimethylcarbamoyl group, an N,N-di-n-octylcarbamoyl group or an N-(methylsulfonyl)carbamoyl group is exemplified.

Among them, $R^{11}$ and $R^{12}$ are preferably a hydrogen atom or an alkyl group. Of the alkyl groups, a methyl group and an ethyl group are particularly preferred.

The alkyl group and aryl group represented by $R^{13}$, $R^{14}$ or $R^{15}$ are preferably the alkyl group and aryl group described for $R^{11}$ and $R^{12}$, respectively.

The divalent connecting group represented by $L^1$ is preferably a connecting group selected from —CO—, —O—, —HN—, a divalent aliphatic group, a divalent aromatic group and a combination of these groups, and preferably has 30 or less carbon atoms including a number of carbon atom of the substituent which may be present described hereinafter. The connecting group is more preferably an alkylene group (having preferably from 1 to 20 carbon atoms, more preferably from 1 to 10 carbon atoms) or an arylene group (having preferably from 5 to 15 carbon atoms, more preferably from 6 to 10 carbon atoms), for example, a phenylene group or a xylylene group. Specific examples thereof include connecting groups shown below.

—$CH_2$— —$CH_2CH_2$— —$CH_2CH_2CH_2$—
—$CH_2CH_2CH_2CH_2$— —$CH_2CH_2CH_2CH_2CH_2$—
—$CH_2CH_2CH_2CH_2CH_2CH_2$—

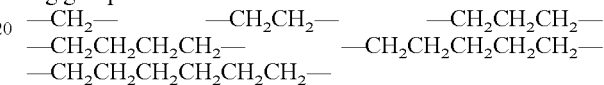

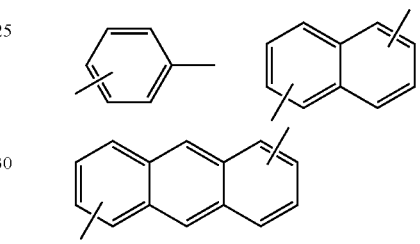

Among them, from the standpoint of stain resistance, $L^1$ is preferably a straight-chain alkylene group having from 2 to 5 carbon atoms, more preferably a straight-chain alkylene group having 2 or 3 carbon atoms, and most preferably a straight-chain alkylene group having 2 carbon atoms.

The connecting group may have a substituent. Examples of the substituent include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

$Y^1$ represents a single bond or a divalent connecting group selected from the group consisting of —CO—, —O—, —HN—, a divalent aliphatic group, a divalent aromatic group and a combination of these groups.

Specific examples of the combination of groups represented by $Y^1$ are set forth below. In each of the specific examples shown below, the left side connects to the main chain.

L1: —CO—O-divalent aliphatic group-
L2: —CO—O-divalent aromatic group-
L3: —CO—NH-divalent aliphatic group-
L4: —CO—NH-divalent aromatic group- The divalent aliphatic group includes an alkylene group, a substituted alkylene group, an alkenylene group, a substituted alkenylene group, an alkinylene group, a substituted alkinylene group and a polyalkyleneoxy group. Among them, an alkylene group, a substituted alkylene group, an alkenylene group and a substituted alkenylene group are preferred, and an alkylene group and a substituted alkylene group are more preferred.

Of the divalent aliphatic groups, a chain structure is preferable than a cyclic structure, and further a straight-chain structure is more preferable than a chain structure having a branch. A number of carbon atoms included in the divalent aliphatic group is preferably from 1 to 20, more preferably from 1 to 15, still more preferably from 1 to 12, particularly preferably from 1 to 10, and most preferably from 1 to 8.

Examples of the substituent for the divalent aliphatic group include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

The divalent aromatic group includes an arylene group which may have a substituent. Specifically, a substituted or unsubstituted phenylene group, naphthylene group and anthrylene group are exemplified. Among them, a phenylene group is preferred.

Examples of the substituent for the divalent aromatic group include an alkyl group in addition to the substituents described for the divalent aliphatic group above.

Specific examples of the structure represented by formula (a1-1) include structures shown below.

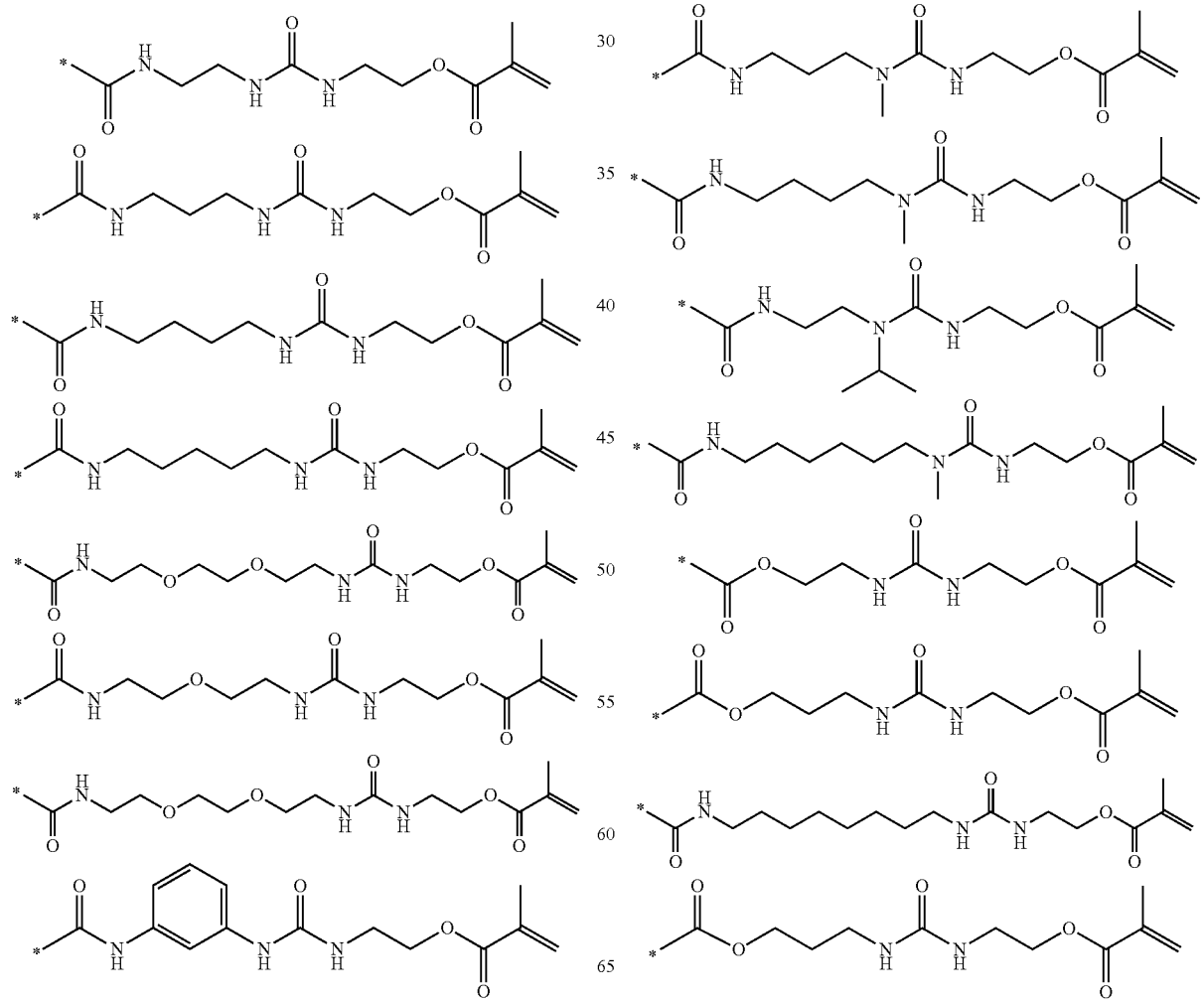

-continued
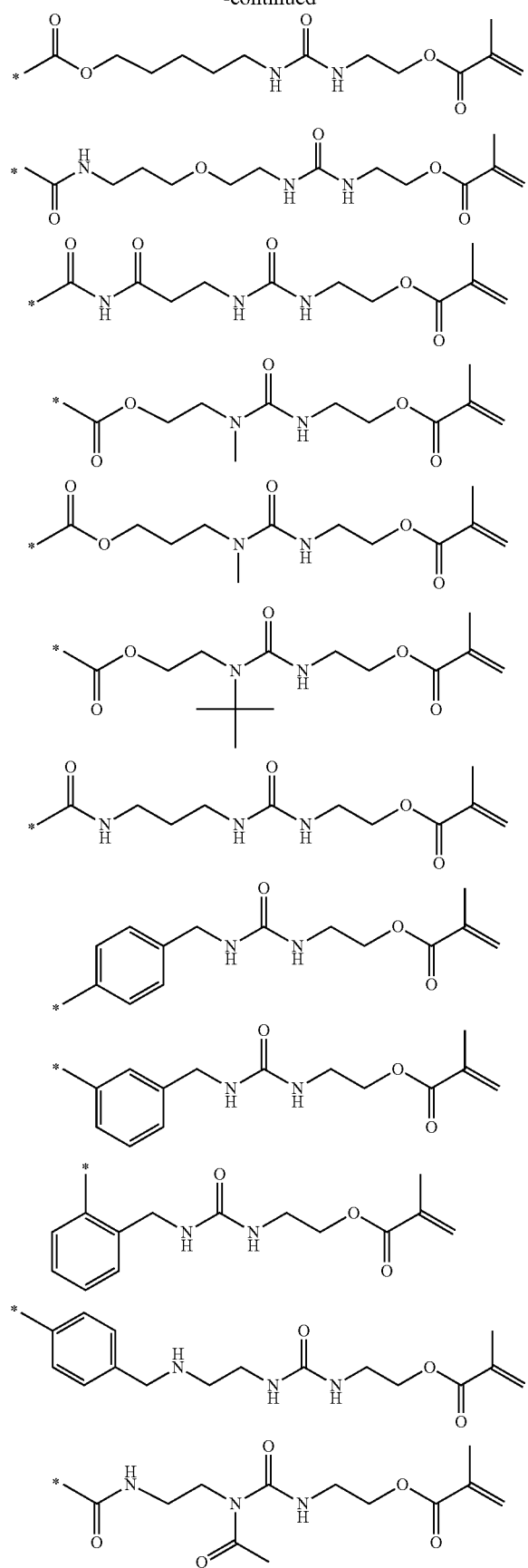
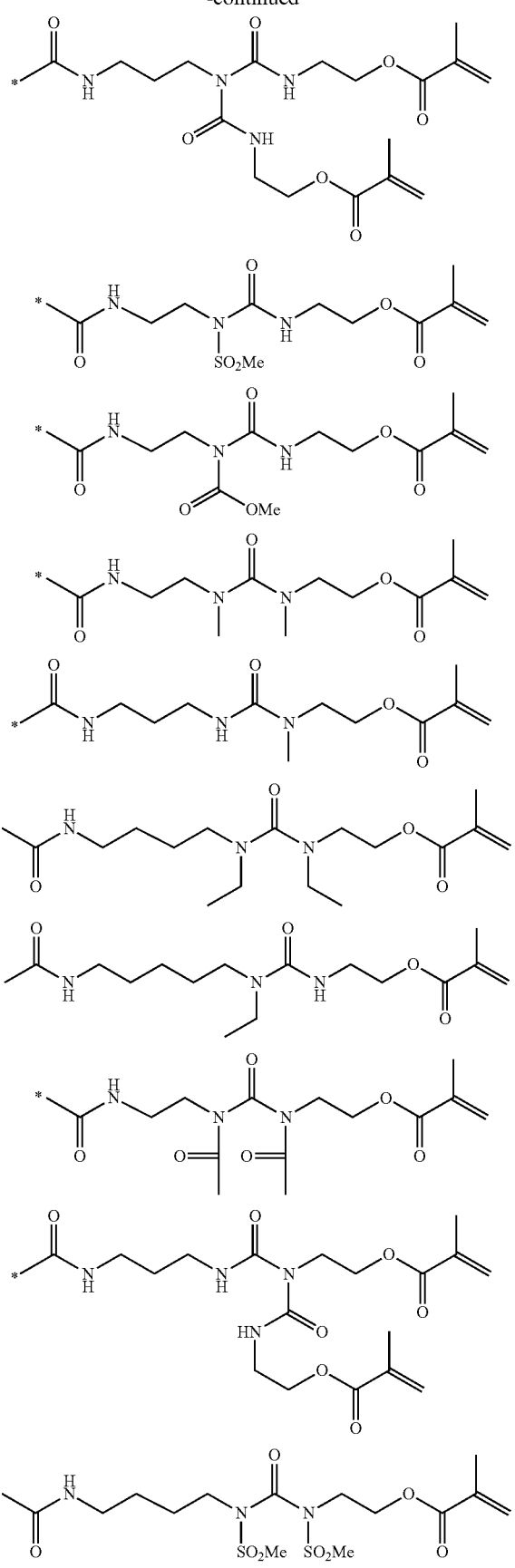

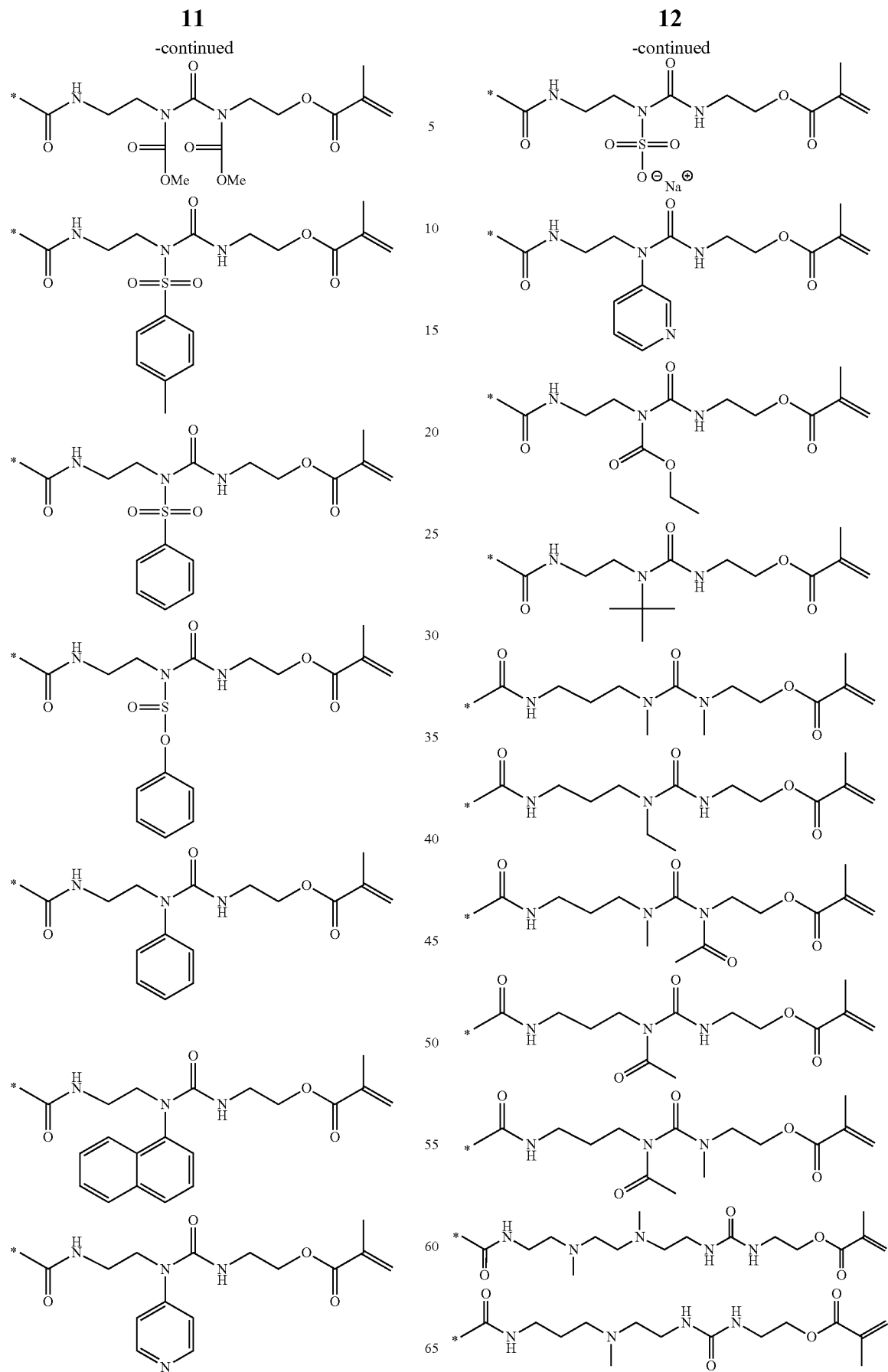

13
-continued
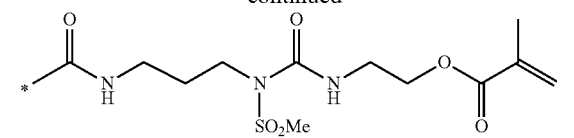
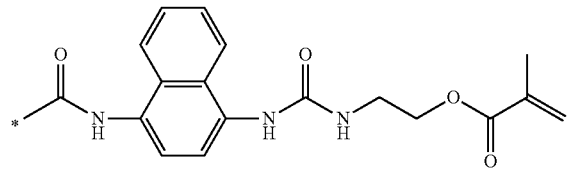
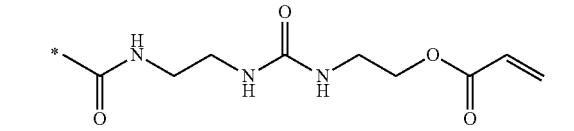
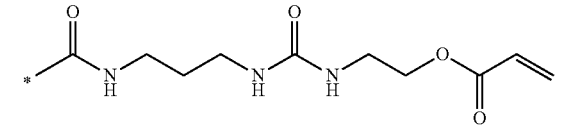
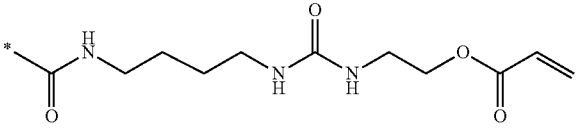
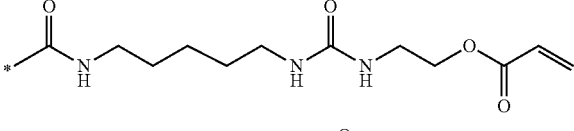
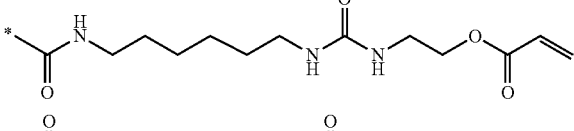
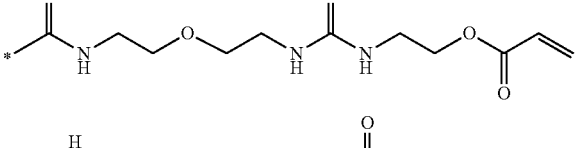
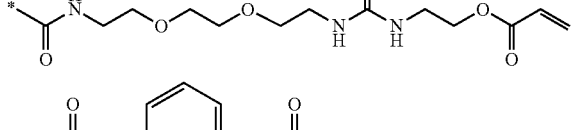
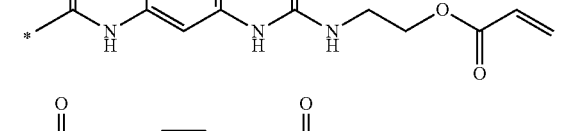
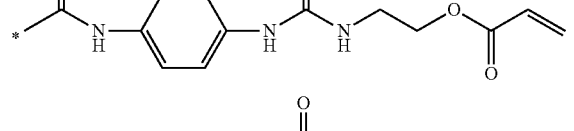
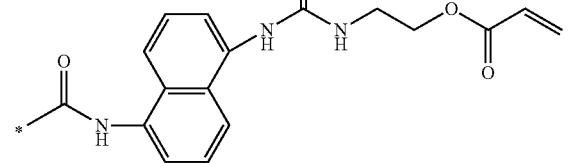
14
-continued
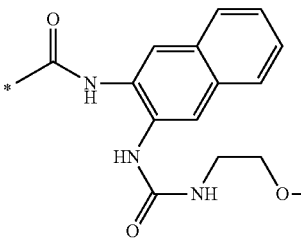
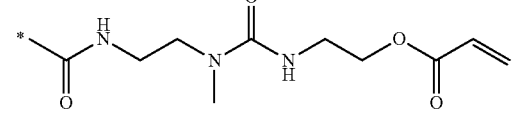
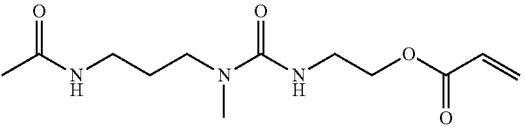
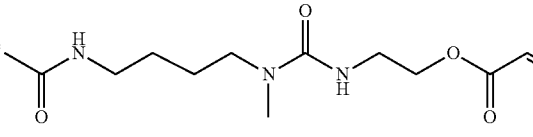
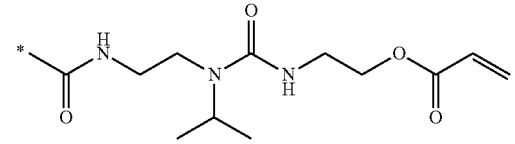
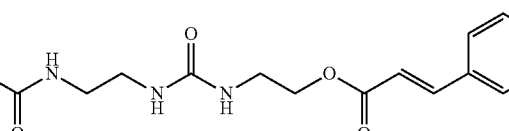
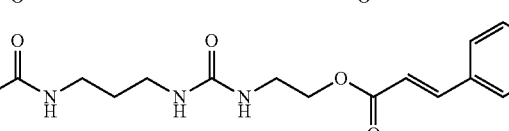
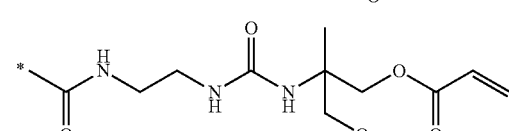
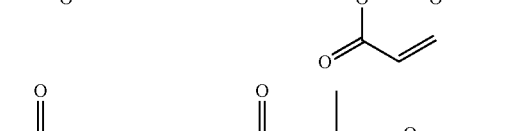
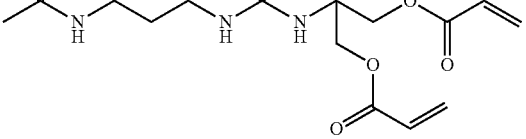
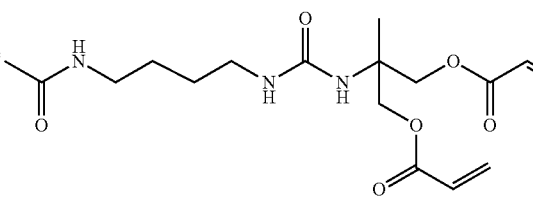

-continued

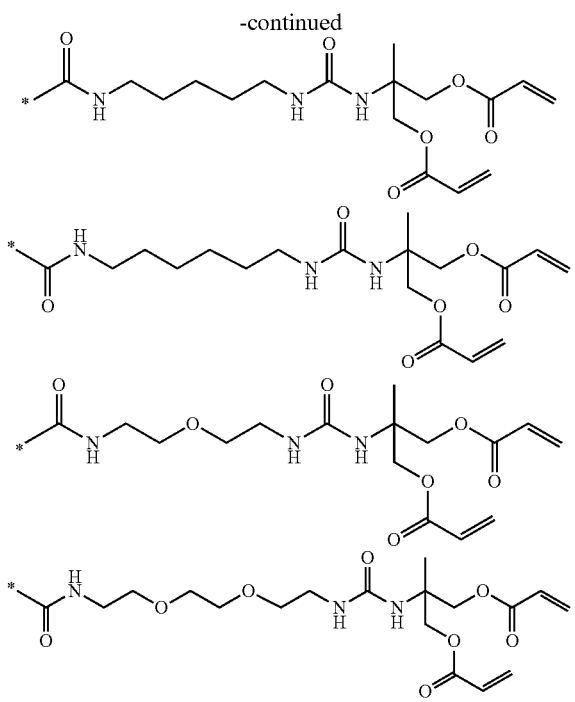

The repeating unit (a1) having a side chain having a structure represented by formula (a1-1) according to the invention, which has at least one radical polymerizable group, is preferably a repeating unit represented by formula (A1) shown below:

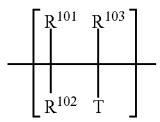
(A1)

In formula (A1), $R^{101}$ to $R^{103}$ each independently represents a hydrogen atom, an alkyl group having from 1 to 6 carbon atoms or a halogen atom, and T represents the structure represented by formula (a1-1) described above. The preferred embodiments are also same as those described in formula (a1-1) above.

The polymer compound having a structure represented by formula (a1-1) in its side chain can be synthesized using a polymer compound having an amine structure in its side chain as a precursor. Since the amine compound ordinarily has high nucleophilic reactivity, the desired reaction can be conducted even in a protic solvent.

Even into a polymer compound of high hydrophilicity which has low solubility in an aprotic solvent but has high solubility in a protic solvent, for example, an alcohol or water, a polymerizable group can be introduced in the protic solvent by utilizing the reactivity of the amine structure.

In the specific polymer compound, the repeating unit (a1) having a structure represented by formula (a1-1) in its side chain is contained preferably from 1 to 50% by mole, more preferably from 1 to 30% by mole, most preferably from 1 to 20% by mole, based on the total repeating unit constituting the specific polymer compound.

(a2) Repeating Unit Having Zwitter Ion Structure in its Side Chain

The specific polymer compound according to the invention preferably contains a repeating unit having a zwitter ion structure in its side chain in order to sufficiently exhibit the effect of the specific polymer compound. The side chain having a zwitter ion structure is preferably represented by formula (a2-1) or (a2-2) shown below.

(a2-1)

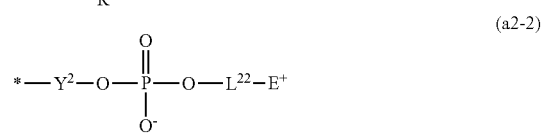
(a2-2)

In formula (a2-1), $R^{21}$ and $R^{22}$ each independently represents a hydrogen atom, an alkyl group, an alkenyl group, an alkynyl group, an aryl group or a heterocyclic group, or $R^{21}$ and $R^{22}$ may be combined with each other toから a ring structure, $L^{21}$ represents a divalent connecting group, $A^-$ represents a structure having an anion, $Y^2$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

The ring structure formed by combining $R^{21}$ and $R^{22}$ with each other may contain a hetero atom, for example, an oxygen atom and is preferably a 5-membered to 10-membered ring, and more preferably a 5-membered or 6-membered ring.

A number of carbon atoms of each of $R^{21}$ and $R^{22}$ including a number of carbon atoms of a substituent which may be present described hereinafter is preferably from 1 to 30, more preferably from 1 to 20, particularly preferably from 1 to 15, and most preferably from 1 to 8.

Examples of the alkyl group represented by each of $R^{21}$ and $R^{22}$ include a methyl group, an ethyl group, a propyl group, an octyl group, an isopropyl group, a tert-butyl group, an isopentyl group, a 2-ethylhexyl group, a 2-methylhexyl group and a cyclopentyl group.

Examples of the alkenyl group represented by each of $R^{21}$ and $R^{22}$ include a vinyl group, an allyl group, a prenyl group (for example, a dimethylallyl group or a geranyl group) and an oleyl group.

Examples of the alkynyl group represented by each of $R^{21}$ and $R^{22}$ include an ethynyl group, a propargyl group and a trimethylsilylethynyl group.

Examples of the aryl group represented by each of $R^{21}$ and $R^{22}$ include a phenyl group, a 1-naphtyl group and a 2-naphthyl group. Examples of the heterocyclic group include a furanyl group, a thiophenyl group and a pyridinyl group.

These groups may have a substituent. Examples of the substituent include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

$R^{21}$ and $R^{22}$ each particularly preferably represents a hydrogen atom, a methyl group or an ethyl group in view of the effect and ready availability.

The divalent connecting group represented by $Y^2$ includes a single bond or a divalent connecting group selected from the group consisting of —CO—, —O—, —NH—, a divalent aliphatic group, a divalent aromatic group and a combination thereof.

Specific examples of the combination of groups represented by $Y^2$ are set forth below. In each of the specific examples shown below, the left side connects to the main chain.

L1: —CO—O-divalent aliphatic group-

L2: —CO—O-divalent aromatic group-

L3: —CO—NH-divalent aliphatic group-

L4: —CO—NH-divalent aromatic group-

L5: —CO-divalent aliphatic group-

L6: —CO-divalent aromatic group-

L7: —CO-divalent aliphatic group-CO—O-divalent aliphatic group-

L8: —CO-divalent aliphatic group-O—CO-divalent aliphatic group-

L9: —CO-divalent aromatic group-CO—O-divalent aliphatic group-

L10: —CO-divalent aromatic group-O—CO-divalent aliphatic group-

L11: —CO-divalent aliphatic group-CO—O-divalent aromatic group-

L12: —CO-divalent aliphatic group-O—CO-divalent aromatic group-

L13: —CO-divalent aromatic group-CO—O-divalent aromatic group-

L14: —CO-divalent aromatic group-O—CO-divalent aromatic group-

L15: —CO—O-divalent aromatic group-O—CO—NH-divalent aliphatic group-

L16: —CO—O-divalent aliphatic group-O—CO—NH-divalent aliphatic group-

The divalent aliphatic group and divalent aromatic group described above are same as the divalent aliphatic group and divalent aromatic group described for $Y^1$ hereinbefore. Examples of the substituent for the divalent aliphatic group and divalent aromatic group are also same as those described for $Y^1$.

$Y^2$ is preferably a single bond, —CO—, a divalent aliphatic group, a divalent aromatic group or any one of L1 to L4 described above. Further, from the standpoint of stain resistance, $Y^2$ is preferably L1 or L3, and more preferably L3. Moreover, the divalent aliphatic group in L3 is preferably a straight-chain alkylene group having from 2 to 4 carbon atoms, and in view of synthesis, it is most preferably a straight-chain alkylene group having 3 carbon atoms.

$L^{21}$ has the same meaning as $L^1$. From the standpoint of stain resistance, $L^{21}$ is preferably a straight-chain alkylene group having from 3 to 5 carbon atoms, more preferably a straight-chain alkylene group having 4 or 5 carbon atoms, and most preferably a straight-chain alkylene group having 4 carbon atoms.

In formula (a2-1), $A^-$ preferably represents a carboxylate, a sulfonate, a phosphonate or a phosphinate.

Specifically, anions shown below are exemplified.

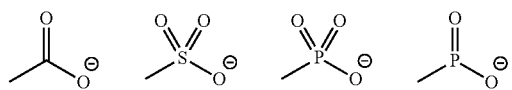

From the standpoint of stain resistance, $A^-$ is most preferably a sulfonate. Further, in formula (a2-1), a combination where $L^{21}$ is a straight-chain alkylene group having 4 to 5 carbon atoms and $A^-$ is a sulfonate is preferred, and a combination where $L^{21}$ is a straight-chain alkylene group having 4 carbon atoms and $A^-$ is a sulfonate is most preferred, A combination where $Y^2$ is L1 or L3, $R^{21}$ and $R^{22}$ each represents an ethyl group or a methyl group, $L^{21}$ is a straight-chain alkylene group having 4 to 5 carbon atoms and $A^-$ is a sulfonate is preferred.

Further, a combination where $Y^2$ is L3, $R^{21}$ and $R^{22}$ each represents a methyl group, $L^{21}$ is a straight-chain alkylene group having 4 carbon atoms and $A^-$ is a sulfonate is more preferred.

Specifically, structures shown below are exemplified as the zwitter ion structure represented by formula (a2-1).

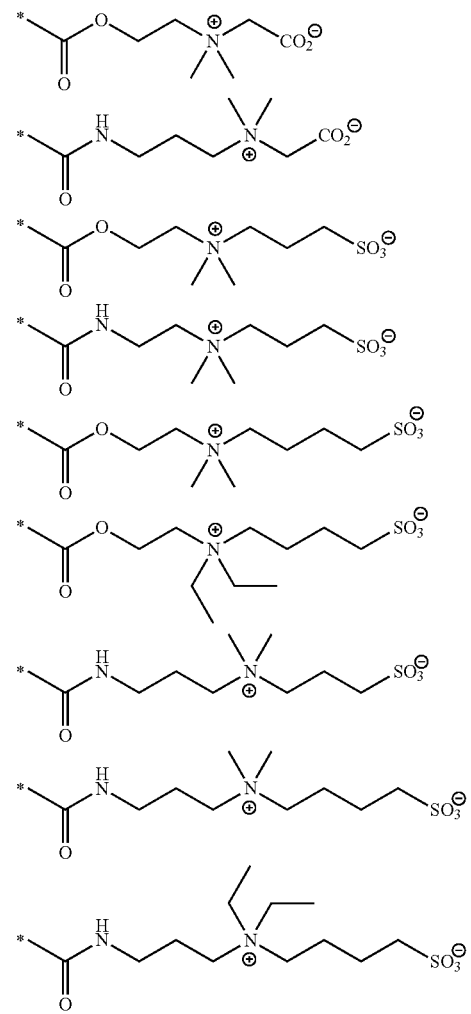

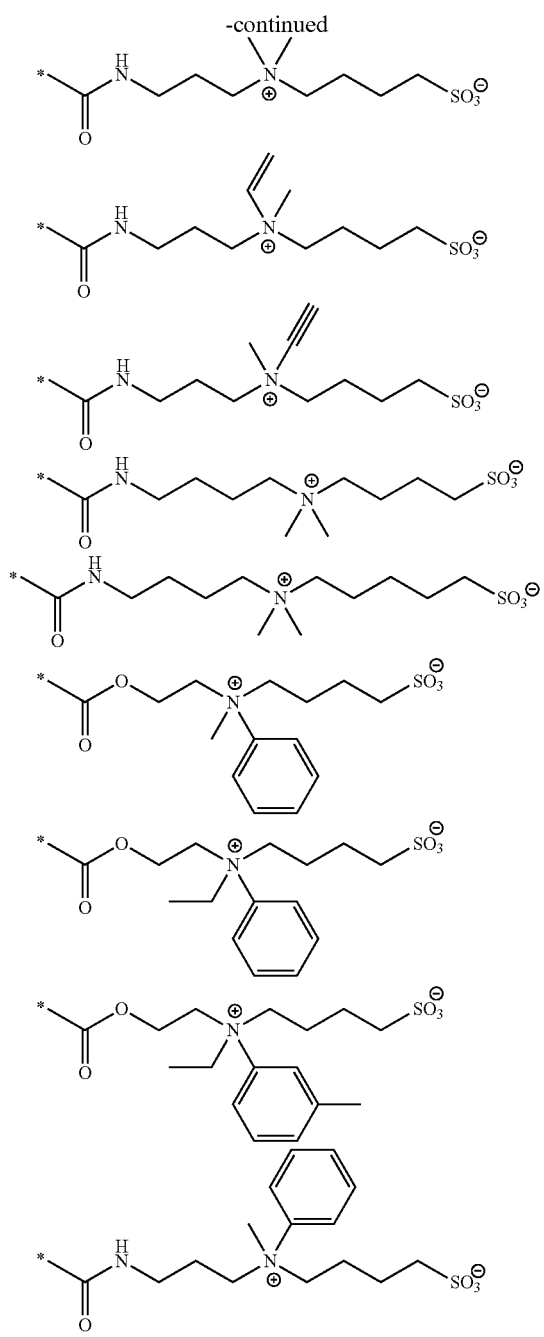

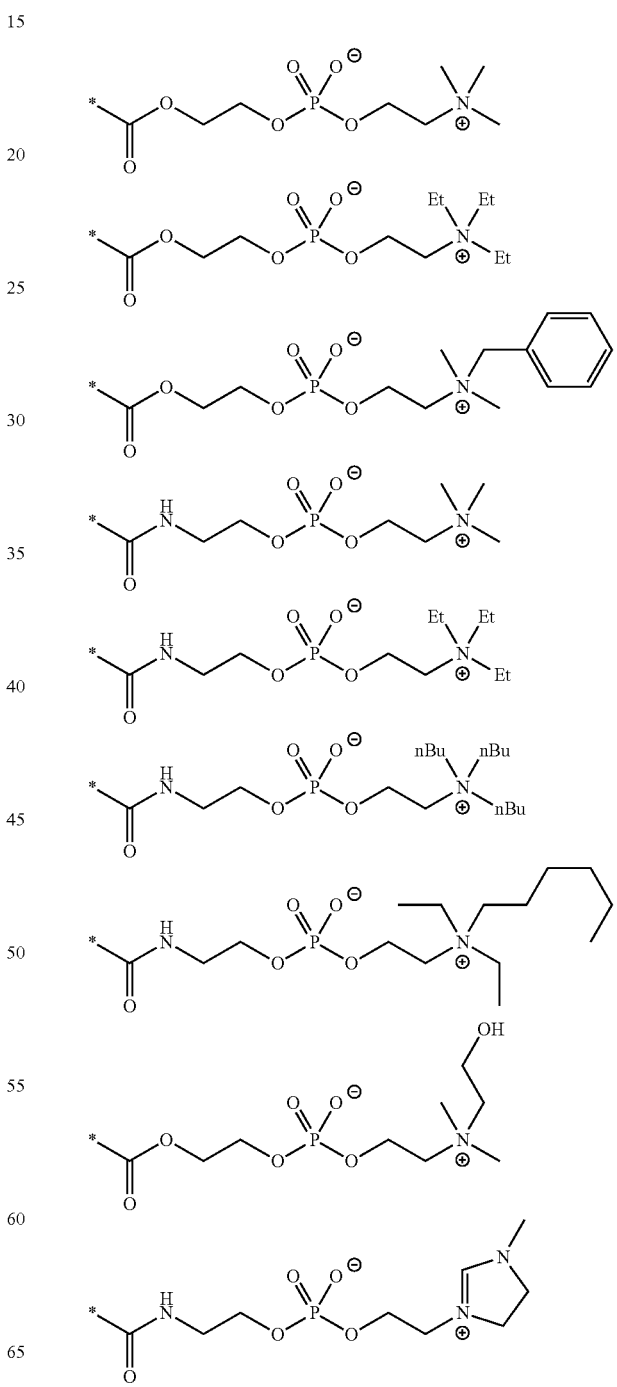

a diethylhexylammonio group, a (2-hydroxyethyl)dimethylammonio group, a pyridinio group, an N-methylimidazolio group, an N-acridinio group, a trimethylphosphonio group, a triethylphosphonio group and a triphenylphosphonio group.

* indicates a site connecting to a main chain of the polymer compound.

A most preferred combination of $L^{22}$, $Y^2$ and $E^+$ is a combination where $L^{22}$ is an alkylene group having from 2 to 4 carbon atoms, $Y^2$ is L1 or L3 and $E^+$ is a trimethylammonio group or a triethylammonio group.

Specifically, structures shown below are exemplified as the zwitter ion structure represented by formula (a2-2).

In formula (a2-2), $L^{22}$ represents a divalent connecting group and is preferably selected from the group consisting of —CO—, —O—, —NH—, a divalent aliphatic group, a divalent aromatic group and a combination thereof. Specific examples and preferred examples thereof are same as those described for the connecting group represented by $L^{21}$ above.

$Y^2$ has the same meaning as $Y^2$ in formula (a2-1) and preferred examples thereof are also same as those described for $Y^3$.

$E^+$ represents a structure having a cation. $E^+$ preferably represents a structure having an ammonium or a phosphonium, and particularly preferably a structure having an ammonium. Examples of the structure having a cation include a trimethylammonio group, a triethylammonio group, a tributylammonio group, a benzyldimethylammonio group,

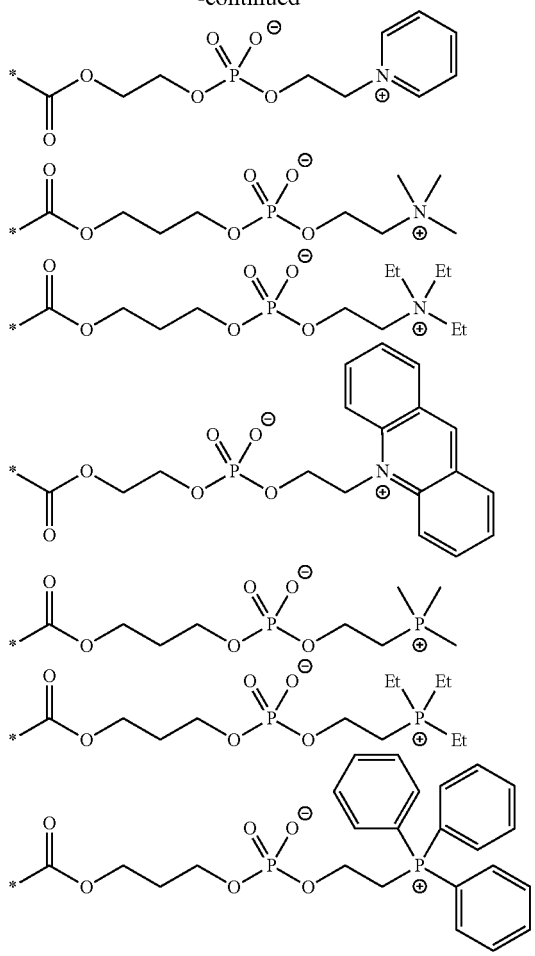

In the invention, specifically, the repeating unit having a zwitter ion structure is preferably represented by formula (A2) shown below.

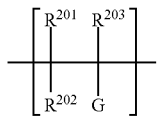

(A2)

In formula (A2), $R^{201}$ to $R^{203}$ each independently represents a hydrogen atom, an alkyl group having from 1 to 6 carbon atoms or a halogen atom. G represents a side chain having a zwitter ion structure and is preferably a structure represented by formula (a2-1) or (a2-2) described above. Preferred examples and combinations with respect to formulae (a2-1) and (a2-2) are same as those described above.

In formula (A2), a particularly preferable side chain for G is a structure represented by formula (a2-1).

The content of the repeating unit (a2) having a zwitter ion structure in the specific polymer compound according to the invention is preferably in a range from 5 to 95% by mole, more preferably in a range from 5 to 80% by mole, most preferably in a range from 10 to 70% by weight, based on the total repeating unit constituting the specific polymer compound, from the standpoint of hydrophilicity.

Although the specific polymer compound according to the invention is able to be synthesized by any hitherto known method, a radical polymerization method and a subsequent urearization reaction of an amino group in a side chain of polymer with an isocyanate having a radical polymerizable group is preferably used for the synthesis thereof.

Ordinary radical polymerization methods are described, for example, in *Shin Kobunshi Jikkengaku* 3, (*New Polymer Experimentation* 3, edited by The Society of Polymer Science, Japan, published on Mar. 28, 1996 (Kyoritsu Shuppan Co., Ltd.), *Kobunshi no Gosei to Hanno* 1, (*Synthesis and Reaction of Polymer* 1), edited by The Society of Polymer Science, Japan, published in May, 1992 (Kyoritsu Shuppan Co., Ltd.), *Shin Jikken Kagaku Koza* 19, *Kobunshi Kagaku (I)*, (*New Experimental Chemistry Course* 19, *Polymer Chemistry (I)*), edited by The Chemical Society of Japan, published on Nov. 20, 1980 (Maruzen Co., Ltd.) and *Busshitsu Kogaku Koza, Kobunshi Gosei Kagaku*, (*Material Engineering Course, Polymer Synthesis Chemistry*), published in September, 1995 (Tokyo Denki University Press) and these methods can be applied.

Further, the specific polymer compound (A) may be a copolymer containing other repeating unit in addition to the repeating units described above. A monomer capable of using copolymerization of the specific polymer compound includes a monomer selected, for example, from acrylic acid esters, methacrylic acid esters, acrylamides, methacrylamides, styrenes, acrylonitrile and methacrylonitrile.

Specifically, as the acrylic acid ester, an alkyl acrylate (preferably having from 1 to 20 carbon atoms in the alkyl group thereof), for example, methyl acrylate, ethyl acrylate, propyl acrylate, butyl acrylate, amyl acrylate, ethylhexyl acrylate, octyl acrylate, tert-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate or tetrahydrofurfuryl acrylate) and an aryl acrylate (for example, phenyl acrylate) are exemplified.

As the methacrylic acid ester, an alkyl methacrylate (preferably having from 1 to 20 carbon atoms in the alkyl group thereof), for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate or tetrahydrofurfuryl methacrylate) and an aryl methacrylate (for example, phenyl methacrylate, cresyl methacrylate or naphthyl methacrylate) are exemplified.

As the styrene, styrene, an alkylstyrene (for example, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene or acetoxymethylstyrene), an alkoxystyrene (for example, methoxystyrene, 4-methoxy-3-methylstyrene or dimethoxystyrene), or a halogen-containing styrene (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene) are exemplified.

As other specific examples, for example, acrylonitrile, methacrylonitrile, methacrylic acid, acrylic acid and 2-acrylamido-2-methylpropanesulfonic acid are exemplified.

A weight average molecular weight (Mw) of the specific polymer compound according to the invention can be appropriately set according to performance design. The weight average molecular weight is preferably from 2,000 to 1,000,000, more preferably from 2,000 to 500,000, and most preferably from 10,000 to 500,000. In the range described above, a sufficient radical polymerization property is obtained.

Specific examples of the specific polymer compound are set forth below together with the weight average molecular weight thereof, but the invention should not be construed as being limited thereto. The composition ratio in the polymer compound is indicated by a mole percentage.

(1)
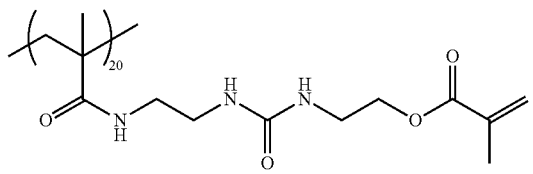

(2)
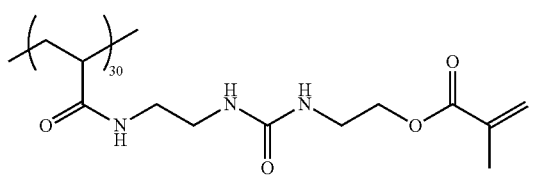

(3)
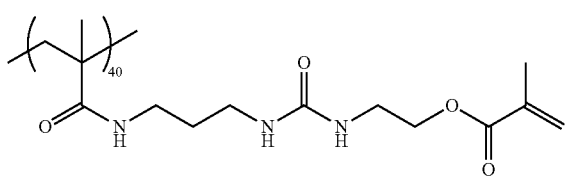

(4)
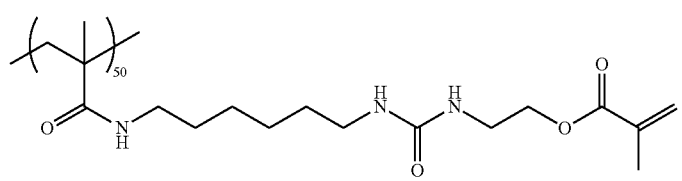

(5)
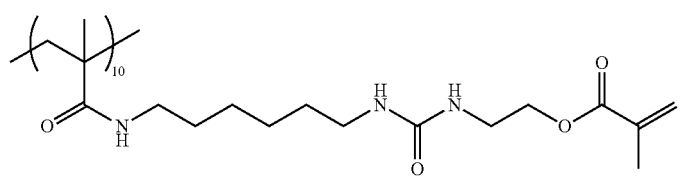

(6)
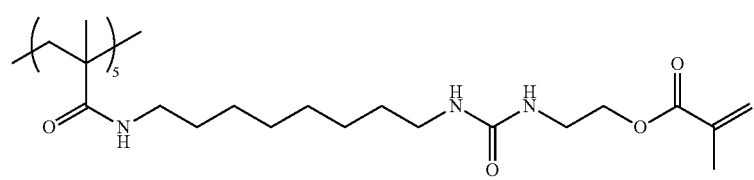

(7)
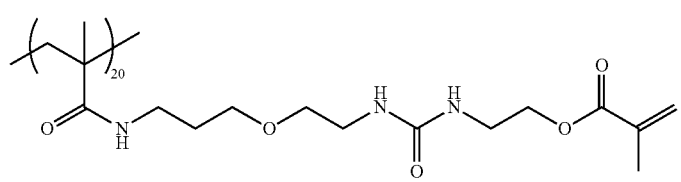

-continued
(8) 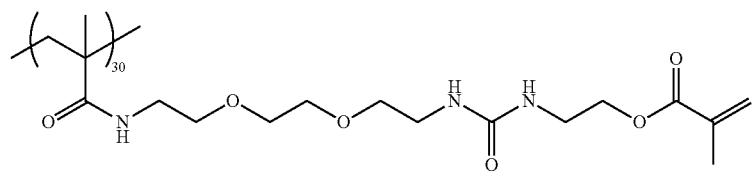
(9) 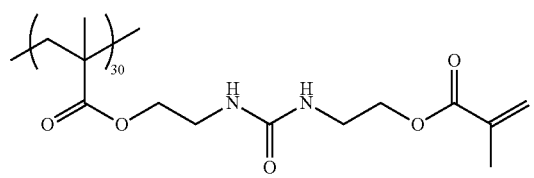
(10) 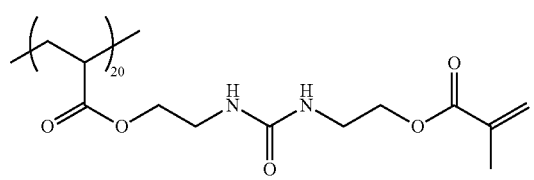
(11) 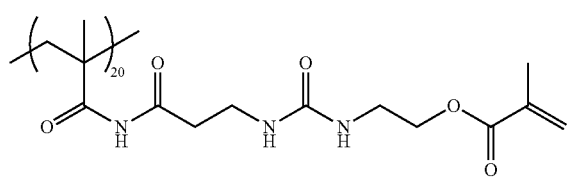
(12) 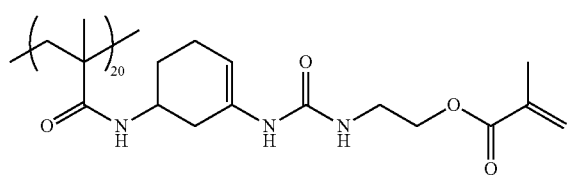
(13) 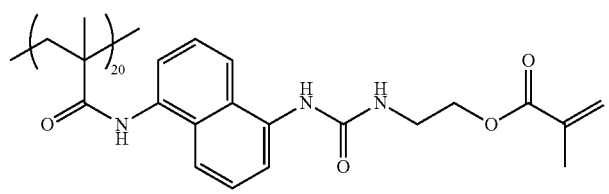
(14) 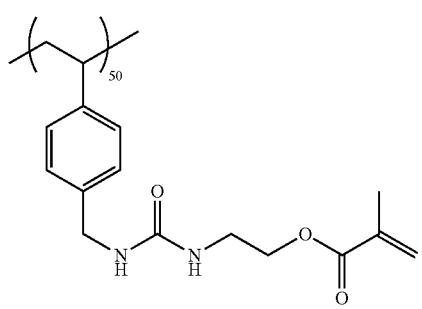
(15) 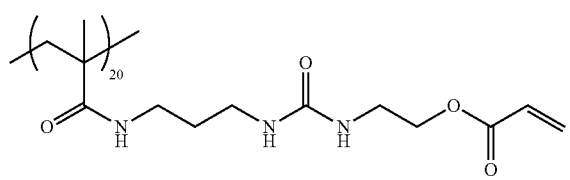

-continued
(16) 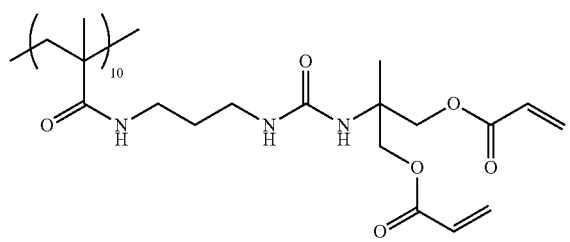
(17) 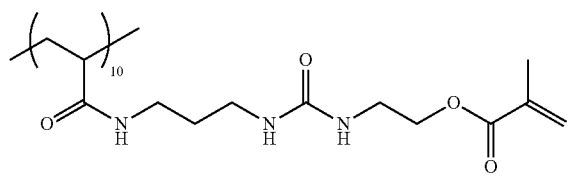
(18) 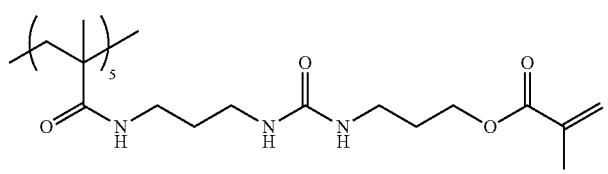
(19) 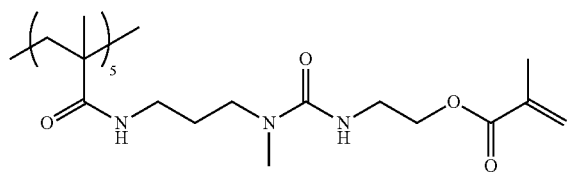
(20) 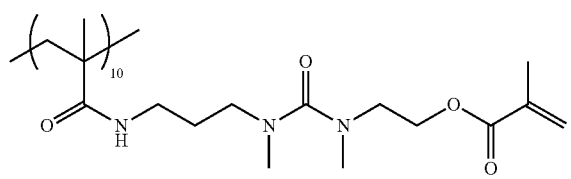
(21) 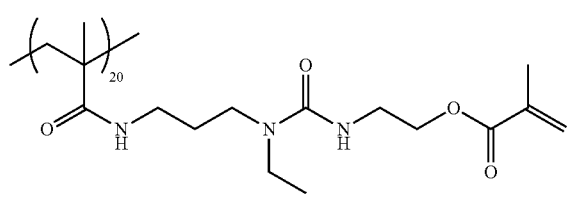
(22) 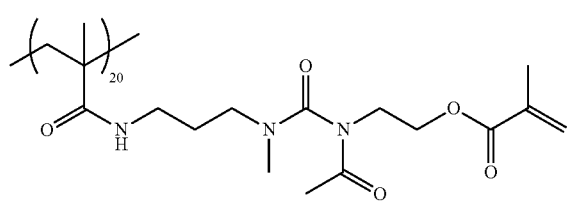
(23) 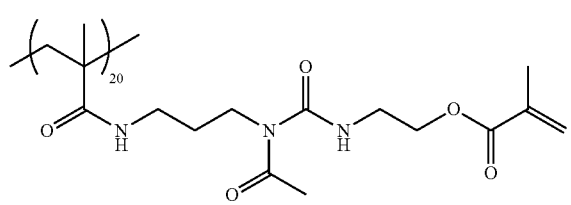

-continued
(24) 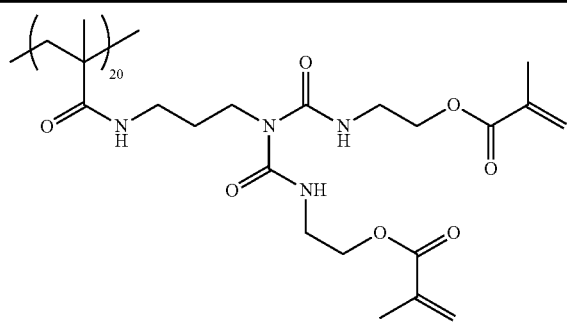
(25) 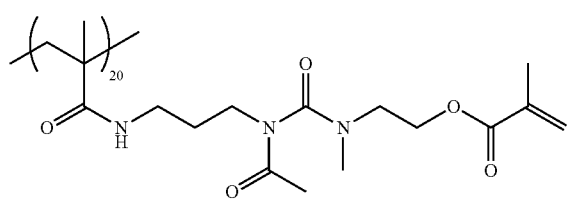
(26) 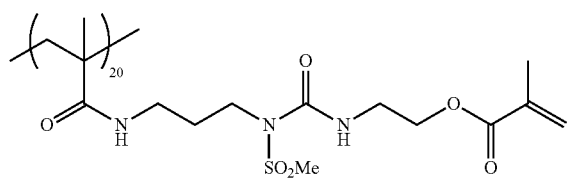
(27) 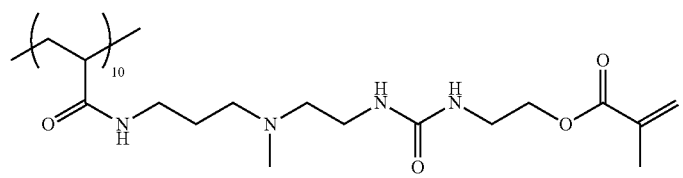
(28) 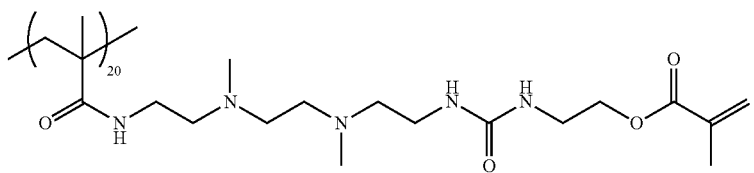
(29) 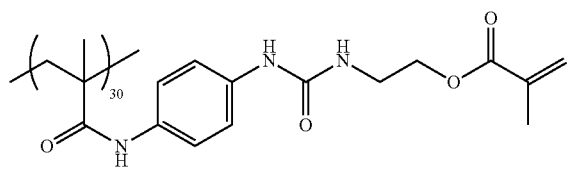
(30) 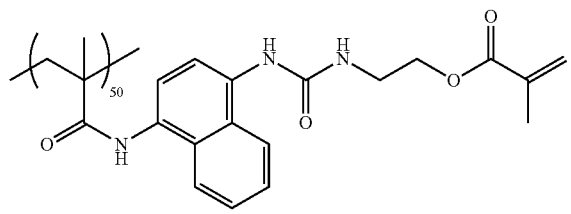
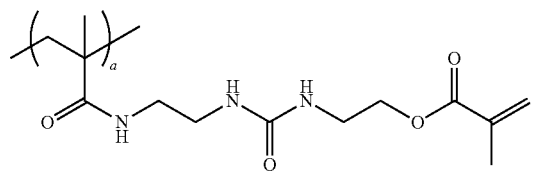

-continued
(40) 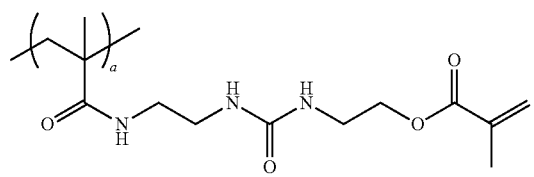
(41) 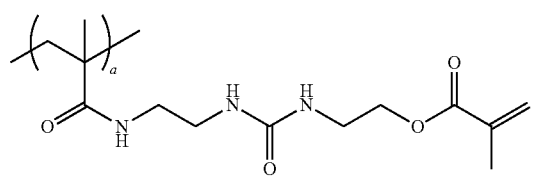
(42) 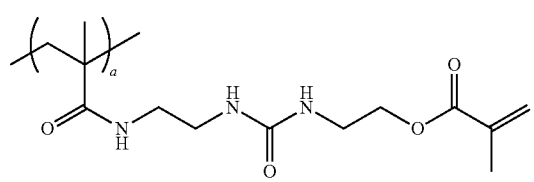
(43) 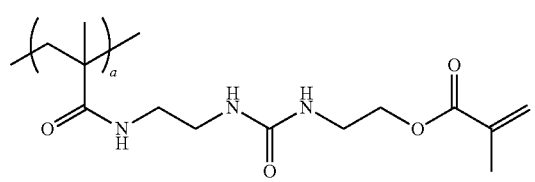
(44) 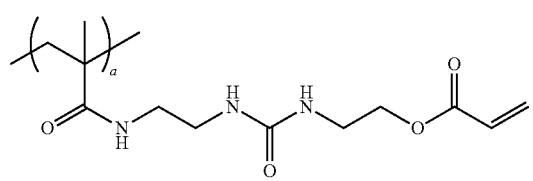
(45) 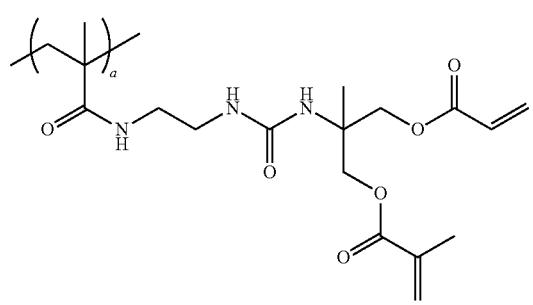
(46) 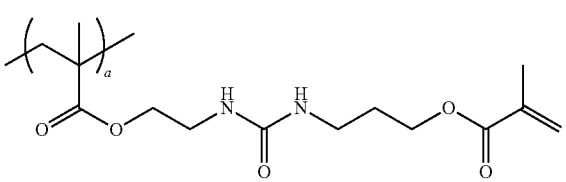
(47) 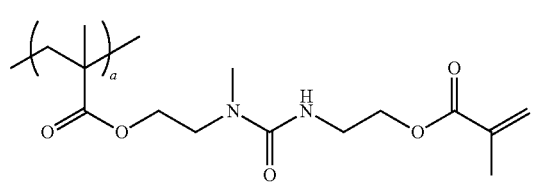

(48) 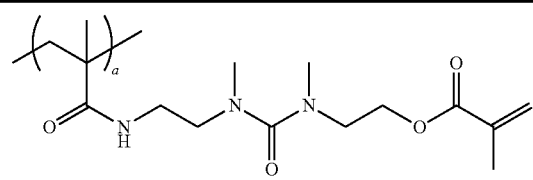
(49) 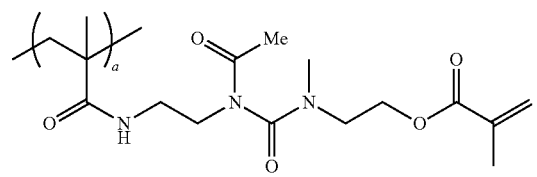
(50) 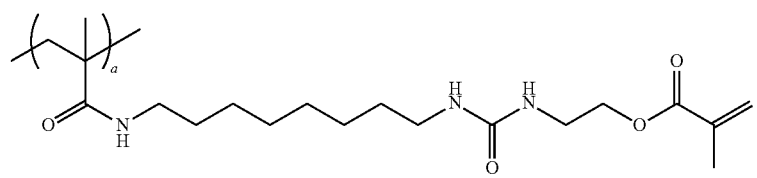
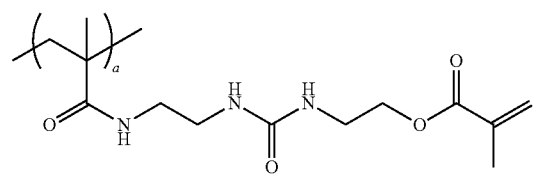
(59) 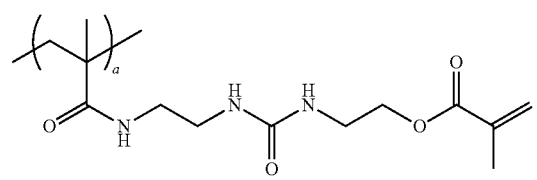
(60) 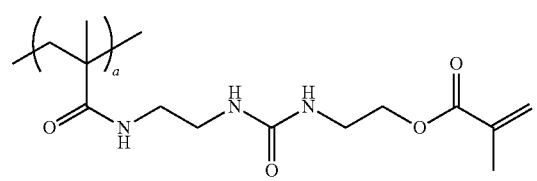
(61) 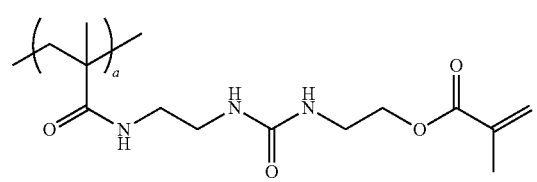
(62) 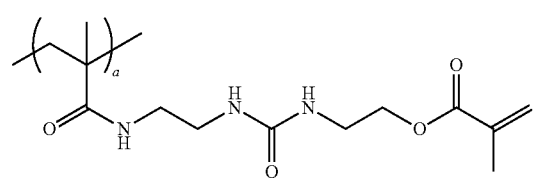
(63) 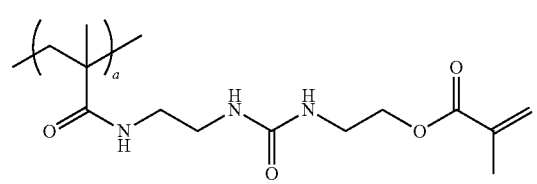

-continued
(64) 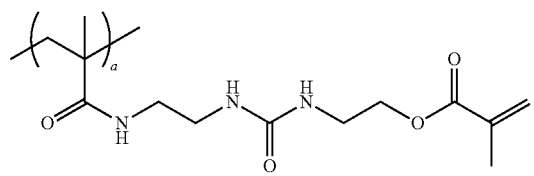
(65) 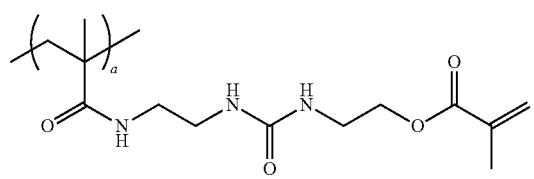
(66) 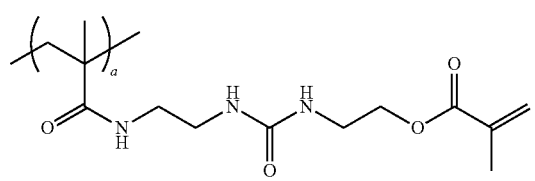
(67) 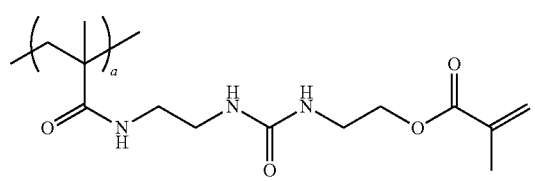
(68) 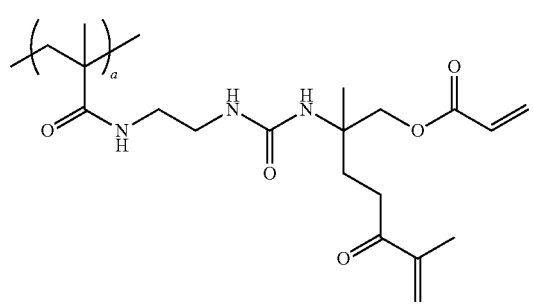
(1) 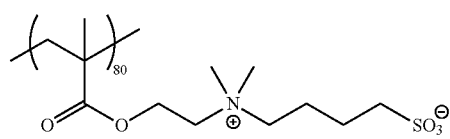 Mw: 45,000
(2) 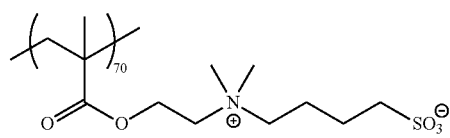 Mw: 65,000
(3) 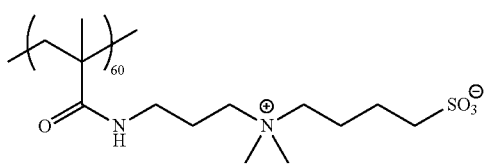 Mw: 80,000

-continued
(4) 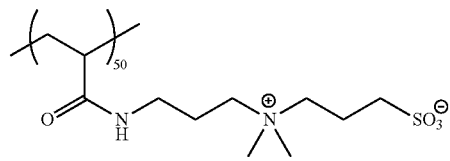 Mw: 70,000
(5) 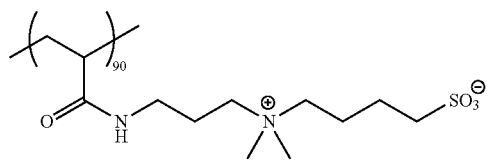 Mw: 105,000
(6) 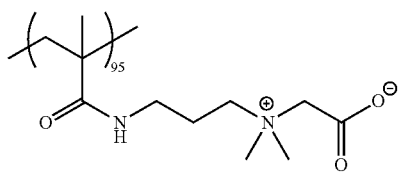 Mw: 125,000
(7) 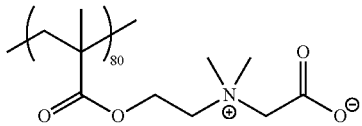 Mw: 140,000
(8) 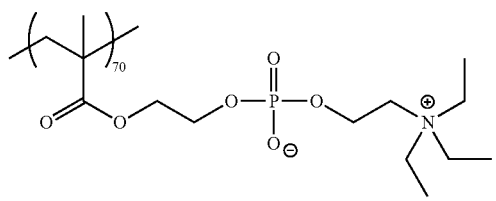 Mw: 500,000
(9) 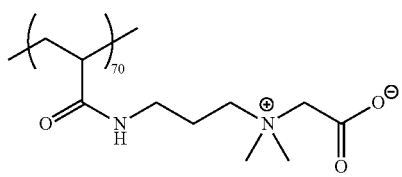 Mw: 120,000
(10) 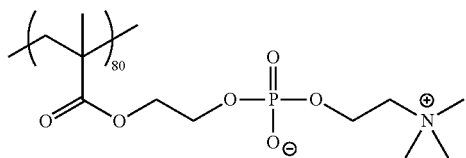 Mw: 90,000
(11) 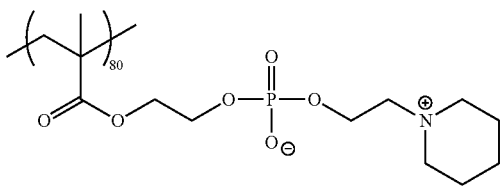 Mw: 25,000
(12) 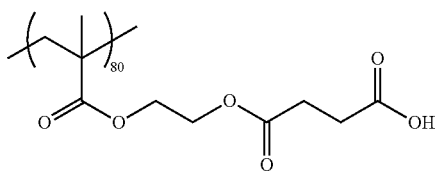 Mw: 10,000

-continued
(13) 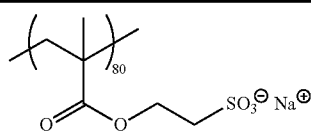 Mw: 80,000
(14) 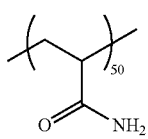 Mw: 30,000
(15) 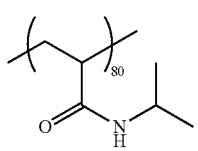 Mw: 10,000
(16) 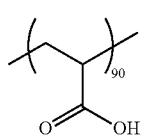 Mw: 15,000
(17) 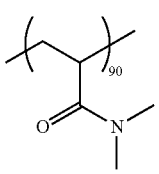 Mw: 20,000
(18) 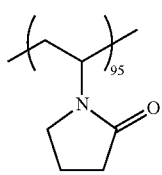 Mw: 22,000
(19) 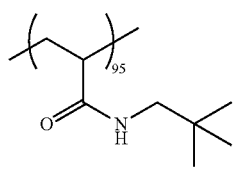 Mw: 10,000
(20) 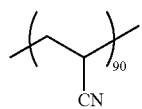 Mw: 5,000
(21) 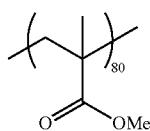 Mw: 25,000
(22) 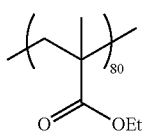 Mw: 10,000
(23) 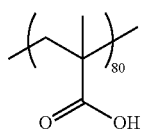 Mw: 10,000

-continued
(24) 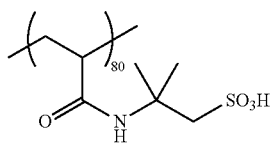 Mw: 22,000
(25) 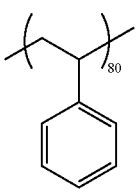 Mw: 80,000
(26) 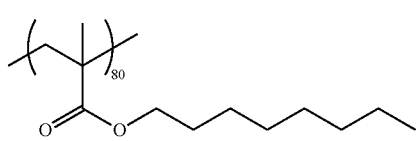 Mw: 30,000
(27) 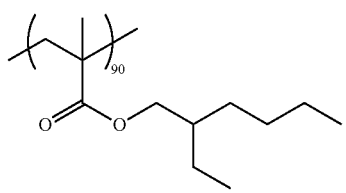 Mw: 15,000
(28) 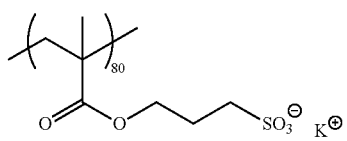 Mw: 15,000
(29) 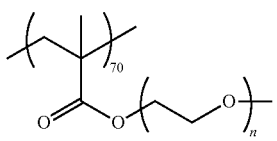
n = 4
Mw: 15,000
(30) 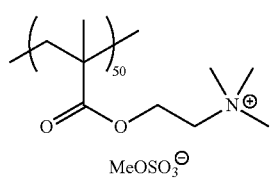 Mw: 15,000
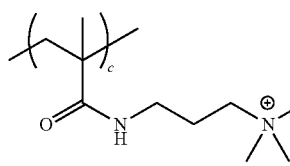
a/b/c = 10/50/40; Mw = 2,000 (31)
a/b/c = 10/50/40; Mw = 45,000 (32)
a/b/c = 10/50/40; Mw = 100,000 (33)
a/b/c = 10/50/40; Mw = 300,000 (34)
a/b/c = 10/50/40; Mw = 700,000 (35)
a/b/c = 10/50/40; Mw = 1,000,000 (36)
a/b/c = 4/50/46; Mw = 55,000 (37)
a/b/c = 40/50/10; Mw = 60,000 (38)
a/b/c = 10/80/10; Mw = 50,000 (39)
(40) 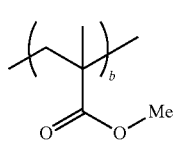 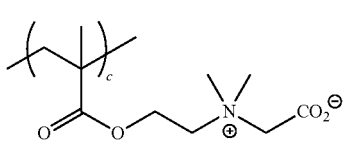 a/b/c = 10/50/40; Mw = 30,000

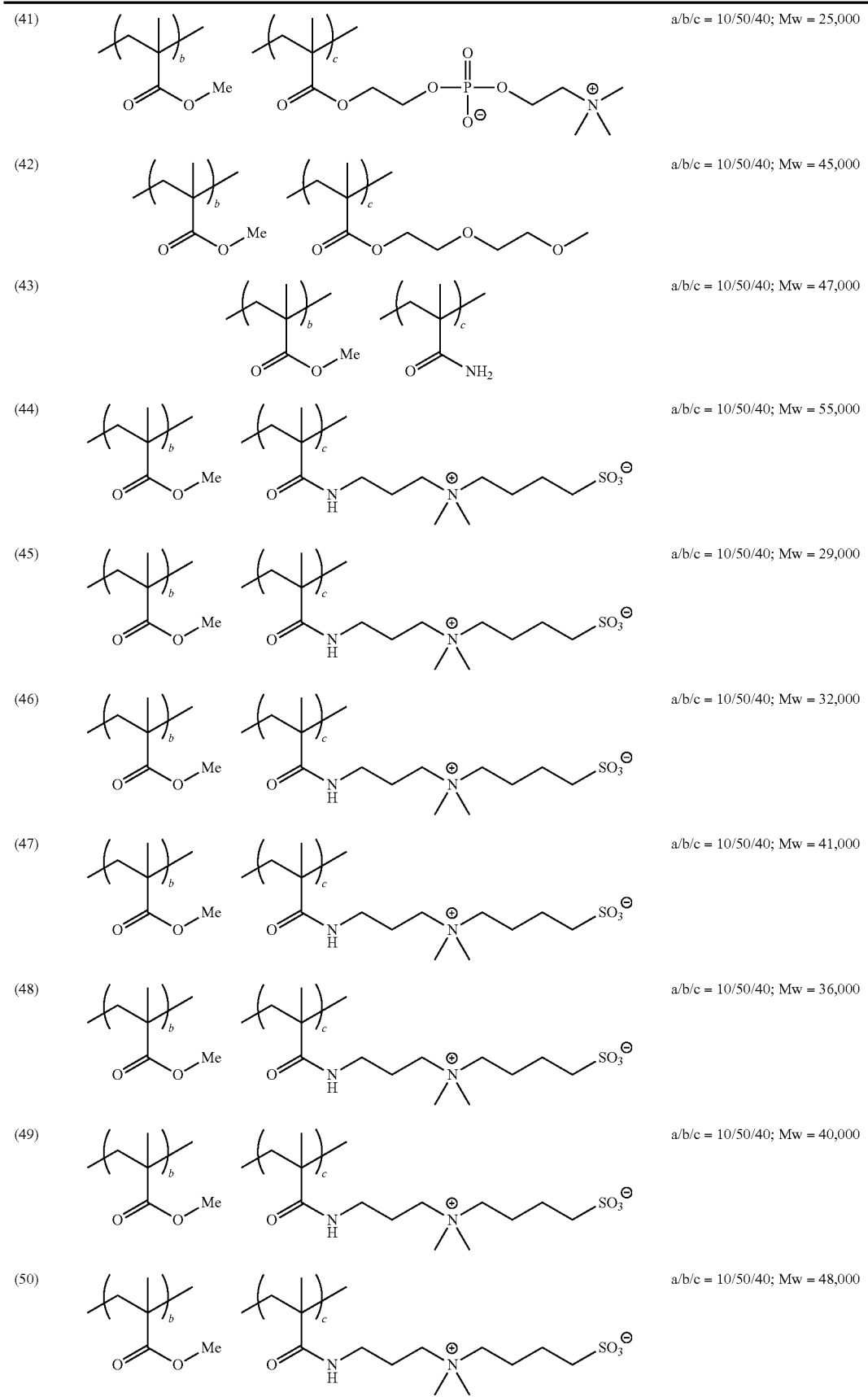

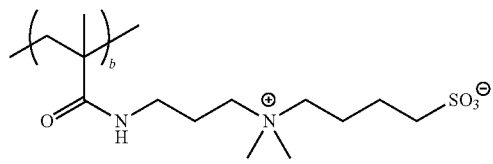
a/b = 15/85; Mw = 2,200 (51)
a/b = 15/85; Mw = 50,000 (52)
a/b = 15/85; Mw = 120,000 (53)
a/b = 15/85; Mw = 250,000 (54)
a/b = 15/85; Mw = 660,000 (55)
a/b = 30/70; Mw = 120,000 (56)
a/b = 50/50; Mw = 105,000 (57)
a/b = 5/95; Mw = 60,000 (58)
(59) 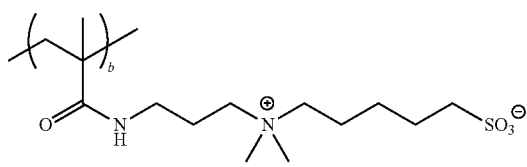 a/b = 15/85; Mw = 50,000
(60) 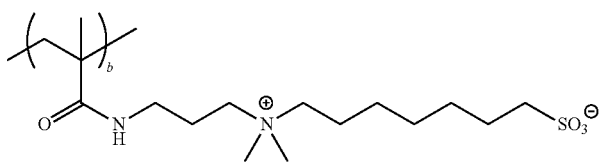 a/b = 15/85; Mw = 45000
(61) 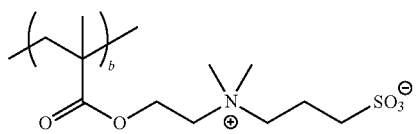 a/b = 15/85; Mw = 55,000
(62) 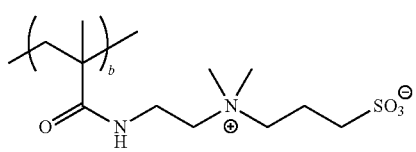 a/b = 15/85; Mw = 62,000
(63) 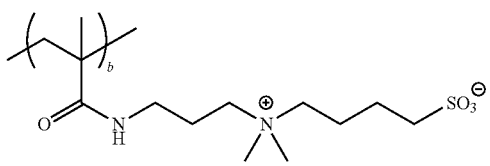 a/b = 15/85; Mw = 70,000
(64) 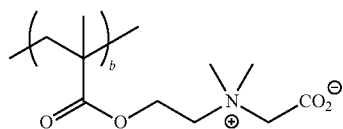 a/b = 15/85; Mw = 48,000
(65) 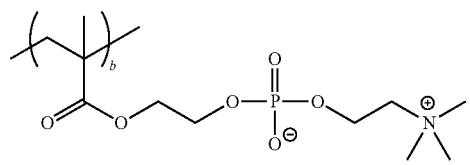 a/b = 15/85; Mw = 50,000
(66) 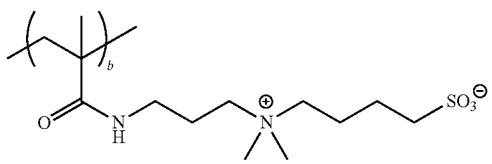 a/b = 15/85; Mw = 27,000

(67) 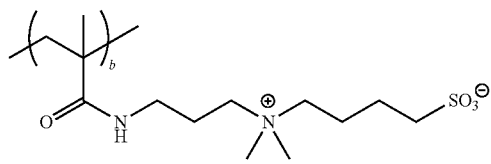
a/b = 15/85; Mw = 33,000

(68) 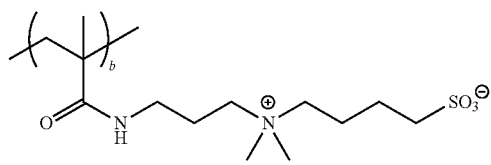
a/b = 15/85; Mw = 49,000

The specific polymer compound is contained preferably from 1.0 to 99% by weight, more preferably from 5 to 90% by weight, most preferably from 10 to 70% by weight, in the polymerizable composition. In the range of content described above, the effect of excellent polymerization property is obtained.

<(B) Polymerization Initiator>

As the polymerization initiator for the invention, a radical polymerization initiator is preferably used. As the radical polymerization initiator, radical polymerization initiators known to those skilled in the art can be used without limitation. Specifically, for example, a trihalomethyl compound, a carbonyl compound, an organic peroxide, an azo compound, an azide compound, a metallocene compound, a hexaarylbiimidazole compound, an organic boron compound, a disulfone compound, an oxime ester compound, an onium salt and a iron arene complex are exemplified. Although a preferred polymerization initiator may be varied according to the usage of the polymerizable composition, for the lithographic printing plate precursor, among them, at least one compound selected from the group consisting of the hexaarylbiimidazole compound, onium salt, trihalomethyl compound and metallocene compound is preferred, and the hexaarylbiimidazole compound or onium salt is particularly preferred. For the antifouling member or the like which is required not to be colored, the carbonyl compound is preferred. The radical polymerization initiators may be appropriately used in combination of two or more thereof.

The hexaarylbiimidazole compound includes, for example, lophine dimers described in JP-B-45-37377 (the term "JP-B" as used herein means an "examined Japanese patent publication") and JP-B-44-86516, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The hexaarylbiimidazole compound is particularly preferably used together with a sensitizing dye having an absorption maximum in a wavelength range from 350 to 450 nm described hereinafter.

The onium salt preferably used in the invention includes a sulfonium salt, an iodonium salt and a diazonium salt. Particularly, a diaryliodonium salt and a triarylsulfonium salt are preferably used. The onium salt is particularly preferably used together with an infrared absorbing agent having an absorption maximum in a wavelength range from 750 to 1,400 nm.

As other radical polymerization initiators, polymerization initiators described in Paragraph Nos. [0071] to [0129] of JP-A-2007-206217 are preferably used.

The polymerization initiators are preferably used individually or in combination of two or more thereof according to the invention.

The amount of the polymerization initiator used in the polymerizable composition according to the invention is preferably from 0.01 to 20% by weight, more preferably from 0.1 to 15% by weight, still more preferably from 1.0 to 10% by weight, based on the weight of the total solid content of the polymerizable composition.

<Other Components>

The polymerizable composition according to the invention preferably contains (C) a sensitizing dye and (D) a polymerizable compound.

<(C) Sensitizing Dye>

The sensitizing dye for use in the polymerizable composition according to the invention can be used without particular limitation as far as it absorbs light at the image exposure to form the excited state and provides energy to the polymerization initiator described above with electron transfer, energy transfer or heat generation thereby improving the polymerization initiation function. Particularly, a sensitizing dye having an absorption maximum in a wavelength range from 350 to 450 nm or from 750 to 1,400 nm is preferably used.

Examples of the sensitizing dye having an absorption maximum in a wavelength range from 350 to 450 nm include merocyanine dyes, benzopyranes, coumarins, aromatic ketones and anthracenes.

Of the sensitizing dyes having an absorption maximum in a wavelength range from 350 to 450 nm, a dye represented by formula (I) shown below is more preferable in view of high sensitivity.

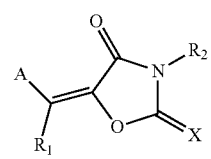
(I)

In formula (I), A represents an aromatic cyclic group which may have a substituent or a heterocyclic group which may have a substituent, X represents an oxygen atom, a sulfur atom or =N(R$_3$), and R$_1$, R$_2$ and R$_3$ each independently represents a monovalent non-metallic atomic group, or A and R$_1$ or R$_2$ and R$_3$ may be combined with each other to form an aliphatic or aromatic ring.

The formula (I) will be described in more detail below. R$_1$, R$_2$ and R$_3$ each independently represents a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Now, A in formula (I) is described below. A represents an aromatic cyclic group which may have a substituent or a heterocyclic group which may have a substituent. The aromatic cyclic group which may have a substituent and heterocyclic group which may have a substituent are same as the substituted or unsubstituted aryl group and substituted or unsubstituted aromatic heterocyclic residue described for any one of R$_1$, R$_2$ and R$_3$ in formula (I), respectively.

Specific examples of the sensitizing dye include compounds described in Paragraph Nos. [0047] to [0053] of JP-A-2007-58170.

Further, sensitizing dyes represented by formulae (II) or (III) shown below can also be used.

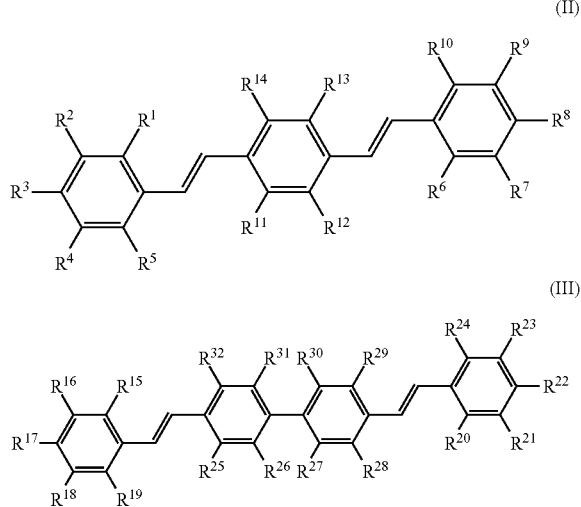

In formula (II), R$^1$ to R$^{14}$ each independently represents a hydrogen atom, an alkyl group, an alkoxy group, a cyano group or a halogen atom, provided that at least one of R$^1$ to R$^{10}$ represents an alkoxy group having 2 or more carbon atoms.

In formula (III), R$^{15}$ to R$^{32}$ each independently represents a hydrogen atom, an alkyl group, an alkoxy group, a cyano group or a halogen atom, provided that at least one of R$^{15}$ to R$^{24}$ represents an alkoxy group having 2 or more carbon atoms.

As specific examples of these sensitizing dyes, compounds described in EP-A-1349006 and WO 2005/029187 are preferably used.

Further, sensitizing dyes described in JP-A-2007-171406, JP-A-2007-206216, JP-A-2007-206217, JP-A-2007-225701, JP-A-2007-225702, JP-A-2007-316582 and JP-A-2007-328243 are also preferably used.

Next, the sensitizing dye having an absorption maximum in a wavelength range from 750 to 1,400 (hereinafter, also referred to as an "infrared absorbing agent") preferably used in the invention is described in detail below. The infrared absorbing agent used is preferably a dye or pigment.

As the dye, commercially available dyes and known dyes described in literatures, for example, *Senryo Binran* (*Dye Handbook*) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Of the dyes, cyanine dyes, squarylium dyes, pyrylium dyes, nickel thiolate complexes and indolenine cyanine dyes are particularly preferred. The cyanine dyes and indolenine cyanine dyes are more preferred. As particularly preferable examples of the dye, a cyanine dye represented by formula (a) shown below is exemplified.

Formula (a)

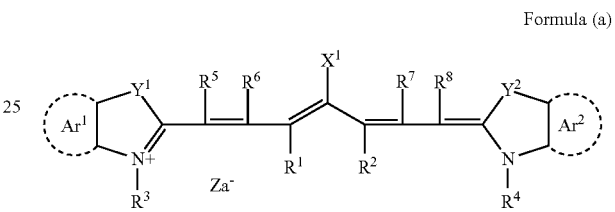

In formula (a), X$^1$ represents a hydrogen atom, a halogen atom, —N(R$^9$)(R$^{10}$), —X$^2$-L$^1$ or a group shown below. R$^9$ and R$^{10}$, which may be the same or different, each represents an aromatic hydrocarbon group having from 6 to 10 carbon atoms, which may have a substituent, an alkyl group having from 1 to 8 carbon atoms or a hydrogen atom or R$^9$ and R$^{10}$ may be combined with each other to from a ring, and preferably represents a phenyl group. X$^2$ represents an oxygen atom or a sulfur atom, L$^1$ represents a hydrocarbon group having from 1 to 12 carbon atoms, an aromatic cyclic group containing a hetero atom (a nitrogen atom, a sulfur atom, an oxygen atom, a halogen atom or a selenium atom) or a hydrocarbon group having from 1 to 12 carbon atoms and containing a hetero atom. Xa$^-$ has the same meaning as Za$^-$ defined hereinafter. R$^a$ represents a hydrogen atom or a substituent selected from an alkyl group, an aryl group, a substituted or unsubstituted amino group and a halogen atom.

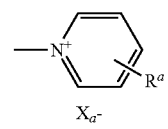

R$^1$ and R$^2$ each independently represents a hydrocarbon group having from 1 to 12 carbon atoms. In view of the preservation stability of a polymerizable composition, it is preferred that R$^1$ and R$^2$ each represents a hydrocarbon group having two or more carbon atoms. It is also preferred that R$^1$ and R$^2$ are combined with each other to form a ring, and in case of fanning the ring, to form a 5-membered ring or 6-membered ring is particularly preferred.

Ar$^1$ and Ar$^2$, which may be the same or different, each represents an aromatic hydrocarbon group which may have a substituent. Preferable examples of the aromatic hydrocarbon group include a benzene ring group and a naphthalene ring group. Preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. Preferable examples of the counter ion for $Za^-$ include a halide ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a polymerizable composition.

Specific examples of the cyanine dye represented by formula (a), which can be preferably used in the invention, include those described in Paragraph Nos. [0017] to [0019] of JP-A-2001-133969.

Further, other particularly preferable examples include specific indolenine cyanine dyes described in JP-A-2002-278057.

Examples of the pigment for use in the invention include commercially available pigments and pigments described in *Colour Index (C.I).*, *Saishin Ganryo Binran* (*Handbook of the Newest Pigments*) compiled by Pigment Technology Society of Japan (1977), *Saishin Ganryo Oyou Gijutsu* (*Newest Application on Technologies for Pigments*), CMC Publishing Co., Ltd. (1986) and *Insatsu Ink Gijutsu* (*Printing Ink Technology*), CMC Publishing Co., Ltd. (1984).

The amount of the sensitizing dye added is preferably from 0.05 to 30 parts by weight, more preferably from 0.1 to 20 parts by weight, most preferably from 0.2 to 10 parts by weight, per 100 parts by weight of the total solid content of the polymerizable composition.

<(D) Polymerizable Compound>

The polymerizable compound for use in the polymerizable composition according to the invention is an addition-polymerizable compound having at least one ethylenically unsaturated double bond and it is selected from compounds having at least one, preferably two or more, terminal ethylenically unsaturated double bonds. The polymerizable compound has a chemical form, for example, a monomer, a prepolymer, specifically, a dimer, a trimer or an oligomer, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with a polyhydric alcohol compound and amides of an unsaturated carboxylic acid with a polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used. These compounds are described in references including JP-T-2006-508380, JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187 and JP-A-10-333321.

Specific examples of the monomer, which is an ester of a polyhydric alcohol compound with an unsaturated carboxylic acid, include, as an acrylic acid ester, for example, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate and polyester acrylate oligomer. As a methacrylic acid ester, for example, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane and bis[p-(methacryloxyethoxy)phenyl]dimethylmethane are exemplified. Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Urethane type addition-polymerizable compounds produced using an addition reaction between an isocyanate and a hydroxy group are also preferably used and specific examples thereof include vinylurethane compounds having two or more polymerizable vinyl groups per molecule obtained by adding a vinyl monomer containing a hydroxy group represented by formula (b) shown below to a polyisocyanate compound having two or more isocyanate groups per molecule, described in JP-B-48-41708.

$$CH_2=C(R_4)COOCH_2CH(R_5)OH \qquad (b)$$

wherein $R_4$ and $R_5$ each independently represents H or $CH_3$.

Also, urethane acrylates as described in JP-A-51-37193, JP-B-2-32293, JP-B-2-16765, JP-A-2003-344997 and JP-A-2006-65210, urethane compounds having an ethylene oxide skeleton described in JP-B-58-49860, JP-B-56-17654, JP-B-62-39417, JP-B-62-39418, JP-A-2000-250211 and JP-A-2007-94138, and urethane compounds having a hydrophilic group described in U.S. Pat. No. 7,153,632, JP-T-8-505958, JP-A-2007-293221 and JP-A-2007-293223 are preferably used.

Of the compounds described above, an isocyanuric acid ethyleneoxide-modified acrylate, for example, tris(acryloyloxyethyl) isocyanurate or bis(acryloyloxyethyl)hydroxyethyl isocyanurate is particularly preferred from the standpoint of excellent balance between hydrophilicity relating to the on-press development property and polymerization ability relating to the printing durability.

Details of the method of using the polymerizable compound, for example, selection of the structure, individual or combination use or an amount to be added, can be appropriately determined in accordance with the characteristic design of the final type of usage (for example, a lithographic printing plate precursor) of the polymerizable composition. The polymerizable compound is used preferably in a range from 5 to 75% by weight, more preferably in a range from 10 to 70% by weight, particularly preferably in a range from 15 to 60% by weight, based on the total solid content of the polymerizable composition.

Now, preferred embodiments and types of usage in case of using the polymerizable composition described above in the lithographic printing plate precursor, antifouling member and antifogging member will be described below.

[In Case of Using in Lithographic Printing Plate Precursor]

The lithographic printing plate precursor according to the invention is a lithographic printing plate precursor having an image-recording layer containing the polymerizable composition described above. The lithographic printing plate precursor may have an undercoat layer between the support and the image-recording layer and a protective layer on the image-recording layer, if desired.

(Image-Recording Layer)

The image-recording layer according to the invention contains the polymerizable composition described above and may further contain other compounds, if desired. The other compounds will be described below.

(1) Polymer Binder Capable of Using Together with Specific Polymer Compound

In the image-recording layer according to the invention, a polymer binder can be used for the purpose of improving film strength of the image-recording layer. The polymer binder which can be used in the invention can be selected from those heretofore known without restriction, and a polymer having a film-forming property is preferred. Among them, an acrylic resin, a polyvinyl acetal resin or a polyurethane resin is preferred.

As the polymer binder preferable for the invention, a polymer having a crosslinkable functional group for improving film strength of the image area in its main chain or side chain, preferably in its side chain, as described in JP-A-2008-195018 is exemplified. Due to the crosslinkable functional group, crosslinkage is formed between the polymer molecules to facilitate curing.

As the crosslinkable functional group, an ethylenically unsaturated group, for example, a (meth)acryl group, a vinyl group, an allyl group or a styryl group or an epoxy group is preferred. The crosslinkable functional group can be introduced into the polymer by a polymer reaction or copolymerization. For instance, a reaction between an acrylic polymer or polyurethane having a carboxyl group in its side chain and glycidyl methacrylate or a reaction between a polymer having an epoxy group and a carboxylic acid containing an ethylenically unsaturated group, for example, methacrylic acid can be utilized.

The content of the crosslinkable group in the polymer binder is preferably from 0.1 to 10.0 mmol, more preferably from 0.25 to 7.0 mmol, most preferably from 0.5 to 5.5 mmol, based on 1 g of the polymer binder.

It is also preferred that the polymer binder for use in the invention further contains a hydrophilic group. The hydrophilic group contributes to impart the on-press development property to the image-recording layer. In particular, coexistence of the crosslinkable group and the hydrophilic group makes it possible to maintain good balance between printing durability and developing property.

The hydrophilic group includes, for example, a hydroxy group, a carboxyl group, an alkylene oxide structure, an amino group, an ammonium group, an amido group, a sulfo group and a phosphoric acid group. Among them, an alkylene oxide structure containing from 1 to 120 alkylene oxide units having 2 or 3 carbon atoms is preferred and an alkylene oxide structure containing from 2 to 120 alkylene oxide units having 2 or 3 carbon atoms is more preferred. In order to introduce a hydrophilic group into the polymer binder, a monomer having the hydrophilic group may be copolymerized.

The polymer may be used in the form of fine particle as described, for example, in WO 2003/087939 and the average particle size thereof is preferably from 30 to 1,000 nm, and more preferably from 60 to 300 nm.

In order to control the ink-receptive property, an oleophilic group, for example, an alkyl group, an aryl group, an aralkyl group or an alkenyl group may be introduced into the polymer binder according to the invention. Specifically, an oleophilic group-containing monomer, for example, an alkyl methacrylate is copolymerized.

Specific examples (1) to (11) of the polymer binder for use in the invention are set forth below, but the invention should not be construed as being limited thereto. A ratio of the repeating unit in the polymer binder shown below is indicated by a molar ratio.

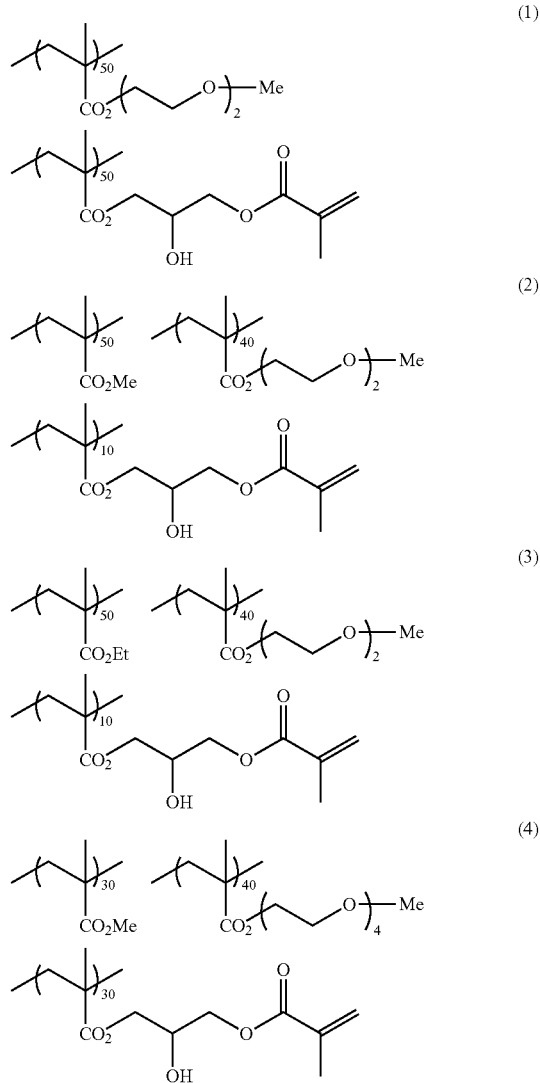

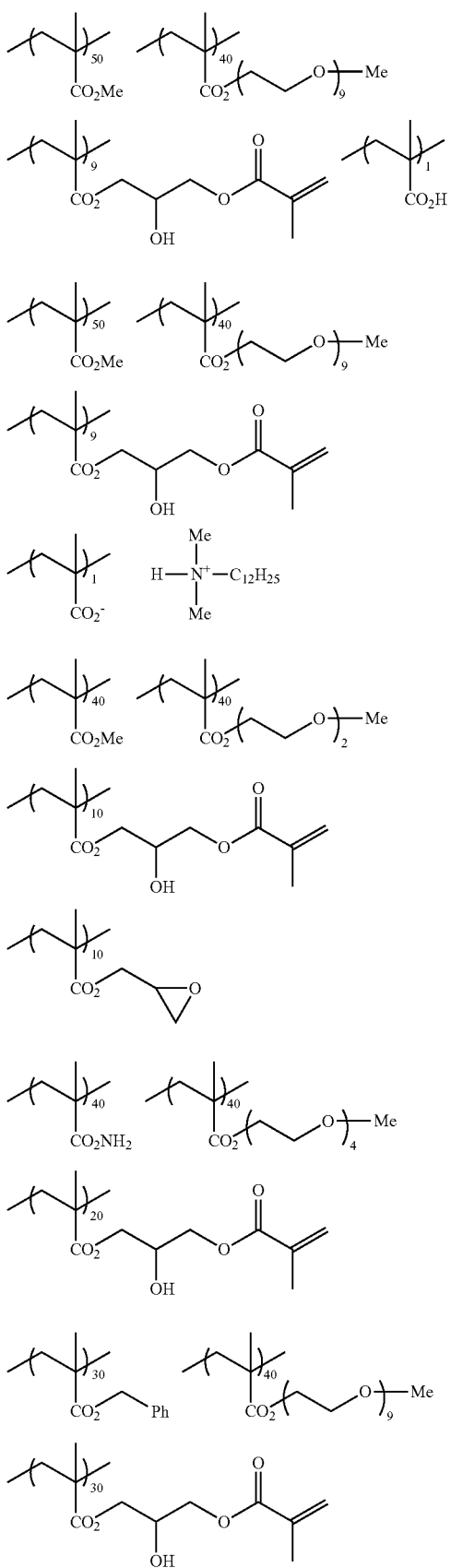
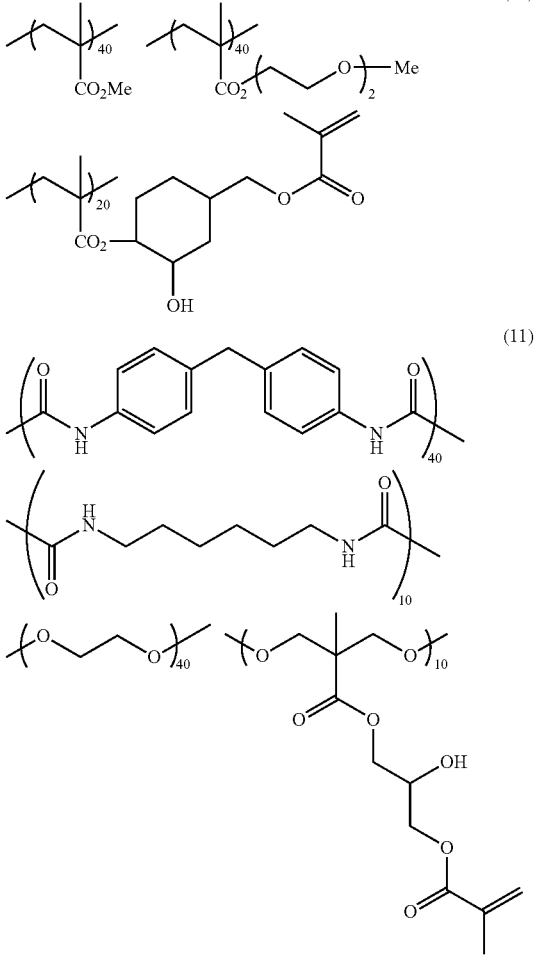

The weight average molecular weight (Mw) of the polymer binder according to the invention is preferably 2,000 or more, more preferably 5,000 or more, and still more preferably from 10,000 to 300,000.

According to the invention, a hydrophilic polymer, for example, polyacrylic acid or polyvinyl alcohol described in JP-A-2008-195018 may be used, if desired. Further, an oleophilic polymer binder is used together with a hydrophilic polymer binder.

The content of the polymer binder is preferably from 5 to 90% by weight, more preferably from 5 to 80% by weight, still more preferably from 10 to 70% by weight, based on the total solid content of the image-recording layer.

(2) Hydrophobilizing Precursor

According to the invention, a hydrophobilizing precursor can be used in order to improve the on-press development property. The hydrophobilizing precursor for use in the invention is a fine particle capable of converting the image-recording layer to be hydrophobic when heat is applied. The fine particle is preferably at least one fine particle selected from hydrophobic thermoplastic polymer fine particle, thermo-reactive polymer fine particle, polymer fine particle having a polymerizable group, microcapsule having a hydrophobic compound encapsulated and microgel (crosslinked polymer fine particle). Among them, polymer fine particle having a polymerizable group and microgel are preferred.

As the hydrophobic thermoplastic polymer fine particle, hydrophobic thermoplastic polymer fine particles described, for example, in *Research Disclosure*, No. 33303, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile, vinyl carbazole or an acrylate or methacrylate having a polyalkylene structure and a mixture thereof. Among them, polystyrene, a copolymer containing styrene and acrylonitrile and polymethyl methacrylate are more preferred.

The average particle size of the hydrophobic thermoplastic polymer fine particle for use in the invention is preferably from 0.01 to 2.0 nm.

The thermo-reactive polymer fine particle for use in the invention includes polymer fine particle having a thermo-reactive group and forms a hydrophobilized region by crosslinkage due to thermal reaction and change in the functional group involved therein.

As the thermo-reactive group of the polymer fine particle having a thermo-reactive group for use in the invention, although a functional group performing any reaction can be used as long as a chemical bond is formed, a polymerizable group is preferred. For instance, an ethylenically unsaturated group (for example, an acryloyl group, a methacryloyl group, a vinyl group or an allyl group) performing a radical polymerization reaction, a cationic polymerizable group (for example, a vinyl group, a vinyloxy group, an epoxy group or an oxetanyl group), an isocyanate group performing an addition reaction or a blocked form thereof, an epoxy group, a vinyloxy group and a functional group having an active hydrogen atom (for example, an amino group, a hydroxy group or a carboxyl group) as the reaction partner thereof, a carboxyl group performing a condensation reaction and a hydroxyl group or an amino group as the reaction partner thereof, and an acid anhydride performing a ring opening addition reaction and an amino group or a hydroxyl group as the reaction partner thereof are preferably exemplified.

As the microcapsule for use in the invention, microcapsule having all or part of the constituting components of the image-recording layer encapsulated as described, for example, in JP-A-2001-277740 and JP-A-2001-277742 is exemplified. The constituting components of the image-recording layer may be present outside the microcapsules. It is a more preferable embodiment of the image-recording layer containing microcapsules that hydrophobic constituting components are encapsulated in microcapsules and hydrophilic components are present outside the microcapsules.

The image-recording layer according to the invention may be an embodiment containing a crosslinked resin particle, that is, a microgel. The microgel can contain a part of the constituting components of the image-recording layer at least one of in the inside and on the surface thereof. Particularly, an embodiment of a reactive microgel containing a radical polymerizable group on the surface thereof is preferred in view of the image-forming sensitivity and printing durability.

As a method of microencapsulation or microgelation of the constituting components of the image-recording layer, known methods can be used.

The average particle size of the microcapsule or microgel is preferably from 0.01 to 3.0 μm, more preferably from 0.05 to 2.0 μm, particularly preferably from 0.10 to 1.0 μm. In the range described above, good resolution and good time lapse stability can be achieved.

The content of the hydrophobilizing precursor is preferably in a range from 5 to 90% by weight based on the total solid content of the image-recording layer.

(3) Hydrophilic Low Molecular Weight Compound

The image-recording layer according to the invention may contain a hydrophilic low molecular weight compound in order to improve the on-press development property without accompanying the decrease in the printing durability.

The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyol compound, e.g., glycerine, pentaerythritol or tris(2-hydroxyethyl) isocyanurate, an organic amine compound, e.g., triethanol amine, diethanol amine or monoethanol amine, or a salt thereof, an organic sulfonic acid compound, e.g., an alkyl sulfonic acid, toluene sulfonic acid or benzene sulfonic acid, or a salt thereof, an organic sulfamic acid compound, e.g., an alkyl sulfamic acid, or a salt thereof, an organic sulfuric acid compound, e.g., an alkyl sulfuric acid or an alkyl ether sulfuric acid, or a salt thereof, an organic phosphonic acid compound, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof and a betaine compound.

According to the invention, it is preferred to incorporate at least one compound selected from a polyol compound, an organic sulfate compound, an organic sulfonate compound and a betaine compound into the image-recording layer.

Specific examples of the organic sulfonate compound include an alkylsulfonate, for example, sodium n-butylsulfonate, sodium n-hexylsulfonate, sodium 2-ethylhexylsulfonate, sodium cyclohexylsulfonate or sodium n-octylsulfonate; an alkylsulfonate containing an ethylene oxide chain, for example, sodium 5,8,11-trioxapentadecane-1-sulfonate, sodium 5,8,11-trioxaheptadecane-1-sulfonate, sodium 13-ethyl-5,8,11-trioxaheptadecane-1-sulfonate or sodium 5,8,11,14-tetraoxatetracosane-1-sulfonate; an arylsulfonate, for example, sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphtylsulfonate, sodium 4-hydroxynaphtylsulfonate, disodium 1,5-naphthalenedisulfonate or trisodium 1,3,6-naphthalenetrisulfonate, and compounds described in Paragraph Nos. [0026] to [0031] of JP-A-2007-276454 and Paragraph Nos. [0020] to [0047] of JP-A-2009-154525. The salt may also be potassium salt or lithium salt.

The organic sulfate compound includes a sulfate of alkyl, alkenyl, alkynyl, aryl or heterocyclic monoether of polyethylene oxide. The number of ethylene oxide unit is preferably from 1 to 4. The salt is preferably a sodium salt, a potassium salt or a lithium salt. Specific examples thereof include compounds described in Paragraph Nos. [0034] to [0038] of JP-A-2007-276454.

As the betaine compound, a compound wherein a number of carbon atoms included in a hydrocarbon substituent on the nitrogen atom is from 1 to 5 is preferred. Specific examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, 3-trimethylammonio-1-porpanesulfonate and 3-(1-pyridinio)-1-porpanesulfonate.

Since the hydrophilic low molecular weight compound has a small structure of hydrophobic portion and almost no surface active function, degradations of the hydrophobicity and film strength in the image area due to penetration of dampening water into the exposed area (image area) of the image-recording layer are prevented and thus, the ink receptive-property and printing durability of the image-recording layer can be preferably maintained.

The amount of the hydrophilic low molecular weight compound added to the image-recording layer is preferably from 0.5 to 20% by weight, more preferably from 1 to 15% by weight, still more preferably from 2 to 10% by weight, based on the total solid content of the image-recording layer. In the range described above, good on-press development property and printing durability are obtained.

The hydrophilic low molecular weight compounds may be used individually or as a mixture of two or more thereof (4) Oil-Sensitizing Agent In order to improve the ink-receptive property, an oil-sensitizing agent, for example, a phosphonium compound, a nitrogen-containing low molecular weight compound or an ammonium group-containing polymer can be used in the image-recording layer. In particular, in the case where an inorganic stratiform compound is incorporated into a protective layer, the oil-sensitizing agent functions as a surface covering agent of the inorganic stratiform compound and prevents deterioration of the ink-receptive property during printing due to the inorganic stratiform compound.

As preferable examples of the phosphonium compound, phosphonium compounds described in JP-A-2006-297907 and JP-A-2007-50660 are exemplified. Specific examples of the phosphonium compound include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio) heptane sulfate and 1,9-bis(triphenylphosphonio)nonane naphthalene-2,7-disulfonate.

As the nitrogen-containing low molecular weight compound, an amine salt and a quaternary ammonium salt are exemplified. Also, an imidazolinium salt, a benzimidazolinium salt, a pyridinium salt and a quinolinium salt are exemplified. Of the nitrogen-containing low molecular weight compounds, the quaternary ammonium salt and pyridinium salt are preferably used. Specific examples the nitrogen-containing low molecular weight compound include tetramethylammonium hexafluorophosphate, tetrabutylammonium hexafluorophosphate, dodecyltrimethylammonium p-toluenesulfonate, benzyltriethylammonium hexafluorophosphate, benzyldimethyloctylammonium hexafluorophosphate, benzyldimethyldodecylammonium hexafluorophosphate and compounds described in Paragraph Nos. [0021] to [0037] of JP-A-2008-284858 and Paragraph Nos. [0030] to [0057] of JP-A-2009-90645.

The ammonium group-containing polymer may be any polymer containing an ammonium group in its structure and is preferably a polymer containing from 5 to 80% by mole of (meth)acrylate having an ammonium group in its side chain as a copolymerization component. Specific examples thereof include polymers described in Paragraph Nos. [0089] to [0105] of JP-A-2009-208458.

As to the ammonium group-containing polymer, its reduced specific viscosity value (unit: ml/g) determined according to the measuring method described below is preferably from 5 to 120, more preferably from 10 to 110, particularly preferably from 15 to 100. When the reduced specific viscosity value described above is calculated in terms of weight average molecular weight, from 10,000 to 150,000 is preferred, from 17,000 to 140,000 is more preferred, and 20,000 to 130,000 is particularly preferred.

<Measuring Method of Reduced Specific Viscosity>

In a 20 ml measuring flask was weighed 1.0 g of polymer and the measuring flask was filled up to the gauge line with N-methylpyrrolidone. The resulting solution was allowed to stand in a thermostatic bath of 30° C. for 30 minutes and put into an Ubbelohde viscometer (viscometer constant: 0.010 cSt/s) and a period for running down of the solution at 30° C. was measured. The measurement was conducted twice for the same sample and an average value of the measurement was determined. The measurement was also conducted for a blank (only N-methylpyrrolidone) in the same manner. The reduced specific viscosity was calculated according to the formula shown below.

$$\text{Reduced specific viscosity (ml/g)} = \frac{\frac{\text{Period for running down of sample solution(sec)} - \text{Period for running down of blank (sec)}}{\text{Period for running down of blank (sec)}}}{\frac{1.0 \text{ (g)}}{2.0 \text{ (ml)}}}$$

Specific examples of the ammonium group-containing polymer are set forth below.

(1) 2-(Trimethylammonio)ethyl methacrylate p-toluenesulfonate/3,6-dioxaheptyl methacrylate copolymer (molar ratio: 10/90, Mw: 45,000)

(2) 2-(Trimethylammonio)ethyl methacrylate hexafluorophosphate/3,6-dioxaheptyl methacrylate copolymer (molar ratio: 20/80, Mw: 60,000)

(3) 2-(Ethyldimethylammonio)ethyl methacrylate p-toluenesulfonate/hexyl methacrylate copolymer (molar ratio: 30/70, Mw: 45,000)

(4) 2-(Trimethylammonio)ethyl methacrylate hexafluorophosphate/2-ethylhexyl methacrylate copolymer (molar ratio: 20/80, Mw: 60,000)

(5) 2-(Trimethylammonio)ethyl methacrylate methylsulfate/hexyl methacrylate copolymer (molar ratio: 40/60, Mw: 70,000)

(6) 2-(Butyldimethylammonio)ethyl methacrylate hexafluorophosphate/3,6-dioxaheptyl methacrylate copolymer (molar ratio: 25/75, Mw: 65,000)

(7) 2-(Butyldimethylammonio)ethyl acrylate hexafluorophosphate/3,6-dioxaheptyl methacrylate copolymer (molar ratio: 20/80, Mw: 65,000)

(8) 2-(Butyldimethylammonio)ethyl methacrylate 13-ethyl-5,8,11-trioxa-1-heptadecanesulfonate/3,6-dioxaheptyl methacrylate copolymer (molar ratio: 20/80, Mw: 75,000)

(9) 2-(Butyldimethylammonio)ethyl methacrylate hexafluorophosphate/3,6-dioxaheptyl methacrylate/2-hydroxy-3-methacryloyloxypropyl methacrylate copolymer (molar ratio: 15/80/5, Mw: 65,000)

The content of the oil-sensitizing agent is preferably from 0.01 to 30.0% by weight, more preferably from 0.1 to 15.0% by weight, still more preferably from 1 to 10% by weight, based on the total solid content of the image-recording layer.

(5) Chain Transfer Agent

The image-recording layer may further contains a chain transfer agent. As the chain transfer agent, for example, compounds having SH, PH, SiH or GeH in their molecules are used. The compound donates hydrogen to a low active radical species to generate a radical or is oxidized and deprotonized to generate a radical.

In particular, a thiol compound (for example, a 2-mercaptobenzimidazole, a 2-mercaptobenzothiazole, a 2-mercaptobenzoxazole, a 3-mercaptotriazole or a 5-mercaptotetrazole) can be preferably used as the chain transfer agent in the image-recording layer.

The content of the chain transfer agent is preferably from 1 to 10% by weight based on the total solid content of the image-recording layer.

(6) Others

Other components, for example, a surfactant, a coloring agent, a print-out agent, a polymerization inhibitor, a higher fatty acid derivative, a plasticizer, an inorganic fine particle or an inorganic stratiform compound may further be added to the image-recording layer. Specifically, compounds and amounts added thereof described, for example, in Paragraph Nos. [0114] to [0159] of JP-A-2008-284817, Paragraph Nos. [0023] to [0027] of JP-A-2006-91479 and Paragraph No. [0060] of U.S. Patent Publication No. 2008/0311520 are preferably used.

<Formation of Image-Recording Layer>

When the invention is applied to a lithographic printing plate precursor, the image-recording layer is formed by dispersing or dissolving each of the necessary constituting components described above in a solvent to prepare a coating solution and coating the solution on a support by a known method, for example, bar coater coating and drying as described in Paragraph Nos. [0142] to [0143] of JP-A-2008-195018. The coating amount (solid content) of the image-recording layer formed on a support after coating and drying may be varied according to the intended purpose but is in general preferably from 0.3 to 3.0 $g/m^2$. In the range described above, good sensitivity and good film property of the image-recording layer can be obtained.

It is preferred that an unexposed area of the image-recording layer can be removed by supplying a developer having pH from 2 to 11 after image exposure. Such an image-recording layer can be constructed by appropriately adjusting at least one of the kinds and amounts of the respective components of the image-recording layer.

It is also preferred that an unexposed area of the image-recording layer can be removed by supplying at least one of printing ink and dampening water on a printing machine after image exposure. Such an image-recording layer can be constructed by appropriately adjusting at least one of the kinds and amounts of the respective components of the image-recording layer.

The solvent used in the coating solution include, for example, 2-butanone, ethylene glycol monomethyl ether, 1-methoxy-2-propanol, 2-methoxyethyl acetate, 1-methoxy-2-propyl acetate and γ-butyrolactone, but the invention should not be construed as being limited thereto. The solvents may be used individually or as a mixture. The solid content concentration of the coating solution is preferably from 1 to 50% by weight.

Various methods can be used for the coating. Examples of the method include bar coater coating, spin coating, spray coating, curtain coating, dip coating, air knife coating, blade coating and roll coating.

(Undercoat Layer)

In the lithographic printing plate precursor according to the invention, an undercoat layer (also referred to as an intermediate layer) is preferably provided between the image-recording layer and the support. The undercoat layer strengthens adhesion between the support and the image-recording layer in the exposed area and makes removal of the image-recording layer from the support easy in the unexposed area, thereby contributing improvement in the developing property without accompanying degradation of the printing durability.

In the case where the undercoat layer is provided, heretofore known polymer compound for the undercoat layer is used as a compound for the undercoat layer.

The undercoat layer may contain a known chelating agent, secondary or tertiary amine, polymerization inhibitor, compound containing an amino group or a functional group having polymerization inhibition ability and a group capable of interacting with a surface of aluminum support or the like (for example, 1,4-diazabicyclo[2,2,2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid or hydroxyethyliminodiacetic acid) in addition to the polymer compound.

The undercoat layer is coated according to a known method. The coating amount (solid content) of the undercoat layer is preferably from 0.1 to 100 $mg/m^2$, and more preferably from 1 to 30 $mg/m^2$.

(Protective Layer)

In the lithographic printing plate precursor according to the invention, it is preferred to provide a protective layer (overcoat layer) on the image-recording layer. The protective layer has a function for preventing, for example, occurrence of scratch in the image-recording layer or ablation caused by exposure with a high illuminance laser beam, in addition to the function for restraining an inhibition reaction against the image formation by means of oxygen blocking.

With respect to the protective layer having such properties, there are described, for example, in U.S. Pat. No. 3,458,311 and JP-B-55-49729. As a polymer having low oxygen permeability for use in the protective layer, any water-soluble polymer and water-insoluble polymer can be appropriately selected to use. The polymers may be used in mixture of two or more thereof, if desired. Specifically, for example, polyvinyl alcohol, a modified polyvinyl alcohol, polyvinyl pyrrolidone, a water-soluble cellulose derivative and poly(meth)acrylonitrile are exemplified.

As the modified polyvinyl alcohol, an acid-modified polyvinyl alcohol having a carboxyl group or a sulfo group is preferably used. Specifically, modified polyvinyl alcohols described in JP-A-2005-250216 and JP-A-2006-259137 are preferably exemplified.

It is also preferred for the protective layer to contain an inorganic stratiform compound, for example, natural mica or synthetic mica as described in JP-A-2005-119273 in order to increase the oxygen blocking property.

Further, the protective layer may contain a known additive, for example, a plasticizer for imparting flexibility, a surfactant for improving a coating property or a fine inorganic particle for controlling a surface slipping property. The oil-sensitizing agent described with respect to the image-recording layer may also be incorporated into the protective layer.

The protective layer is coated according to a known method. The coating amount of the protective layer is preferably in a range from 0.01 to 10 $g/m^2$, more preferably in a range from 0.02 to 3 $g/m^2$, most preferably in a range from 0.02 to 1 $g/m^2$, in terms of the coating amount after drying.

(Support)

As the support of the lithographic printing plate precursor according to the invention, a known support is used. Particularly, an aluminum plate subjected to roughening treatment and anodizing treatment according to a known method is preferred.

Also, an enlarging treatment or a sealing treatment of micropores of the anodized film described in JP-A-2001-253181 and JP-A-2001-322365 or a surface hydrophilizing treatment, for example, with an alkali metal silicate as described in U.S. Pat. Nos. 2,714,066, 3,181,461, 3,280,734 and 3,902,734 or polyvinyl phosphonic acid as described in U.S. Pat. Nos. 3,276,868, 4,153,461 and 4,689,272 may be appropriately selected and applied to the aluminum plate, if desired.

The support preferably has a center line average roughness from 0.10 to 1.2

The support according to the invention may have a backcoat layer containing an organic polymer binder described in JP-A-5-45885 or an alkoxy compound of silicon described in JP-A-6-35174, provided on the back surface thereof, if desired.

[Plate Making Method]

The lithographic printing plate precursor according to the invention is exposed imagewise and then subjected to development processing to prepare a lithographic printing plate. The development processing includes (1) a method of developing with an alkali developer (having pH higher than 11), (2) a method of developing with a developer having pH from 2 to 11, and (3) a method of developing (on-press development) by supplying dampening water and/or ink on a printing machine. According to the invention, (2) the method of developing with a developer having pH from 2 to 11 or (3) the method of developing (on-press development) by supplying dampening water and/or ink on a printing machine is preferred.

<On-Press Development Method>

The on-press development is conducted by mounting the imagewise exposed lithographic printing plate precursor on a printing machine without undergoing any development processing and supplying oily ink and an aqueous component to initiate printing. Specifically, at an early stage of the course of printing, the unexposed area of the image-recording layer is removed by dissolution or dispersion with the oily ink and/or aqueous component and a hydrophilic surface of the support is revealed therewith to form the non-image area. On the other hand, the image-recording layer cured by the exposure forms the oily ink receptive area (image area) having an oleophilic surface. As a result, the aqueous component adheres onto the revealed hydrophilic surface and the oily ink adheres onto the exposed area of the image-recording layer so that conventional printing can be conducted.

The imagewise exposure may be performed on a printing machine after the lithographic printing plate precursor is mounted on the printing machine or may be separately performed using a platesetter or the like. As the oily ink and aqueous component, printing ink and dampening water for conventional lithographic printing can be employed, respectively.

While either the dampening water or printing ink may be supplied at first on the surface of lithographic printing plate precursor, it is preferred to supply the printing ink at first in view of preventing the dampening water from contamination with the component of the image-recording layer removed.

<Method of Developing with Developer Having pH from 2 to 11>

According to a conventional developing process using an alkali developer as the method (1), a protective layer is removed in a pre-water washing step, the alkali development is conducted, the alkali is removed by washing with water in a post-water washing step, gum solution treatment is conducted and drying is conducted in a drying step. On the contrary, in the case of conducting the development of the lithographic printing plate precursor according to the invention using a developer having pH from 2 to 11, the protective layer and the unexposed area of the image-recording layer are together removed so that the resulting lithographic printing plate can be immediately mounted on a printing machine to perform printing. By incorporating a surfactant and/or a water-soluble polymer of oil-desensitization property into such a developer having pH from 2 to 11, the development and gum solution treatment are conducted at the same time so that the post-water washing step is not particularly necessary and after conducting the development and gum solution treatment with one solution, the drying step can be performed. It is preferred that after the development and gum treatment, the excess developer is removed using a squeeze roller, followed by conducting the drying. Specifically, a considerably simplified processing process (gum development) composed of development and gum treatment with one solution and drying can be conducted.

The development according to the invention is performed at liquid temperature ordinarily from 0 to 60° C., preferably from 15 to 40° C., using, for example, a method wherein the imagewise exposed lithographic printing plate precursor is immersed in the developer and rubbed with a brush or a method wherein the developer is sprayed to the imagewise exposed lithographic printing plate precursor and the exposed lithographic printing plate precursor is rubbed with a brush.

The developer having pH from 2 to 11 is preferably an aqueous solution containing water as a main component (containing 60% by weight or more of water based on weight of the developer). In particular, an aqueous solution containing a surfactant (for example, an anionic, nonionic, cationic or amphoteric surfactant) or an aqueous solution containing a water-soluble polymer is preferred. An aqueous solution containing both the surfactant and the water-soluble polymer is also preferred. The pH of the developer is more preferably from 5 to 10.7, still more preferably from 6 to 10.5, and most preferably from 7.5 to 10.3.

The anionic surfactant for use in the developer is not particularly limited and includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkyldiphenylether (di)sulfonic acid salts, alkylphenoxy polyoxyethylene propylsulfonic acid salts, polyoxyethylene alkylsulfophenyl ether salts, N-alkyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, alkylbenzenesulfonic acid salts, alkylnaphthalenesulfonic acid salts and alkyldiphenylether (di)sulfonic acid salts are particularly preferably used.

The cationic surfactant for use in the developer is not particularly limited and hitherto known cationic surfactants may be used. For example, alkylamine salts, quaternary ammonium salts, alkylimidazolinium salts, polyoxyethylene alkyl amine salts and polyethylene polyamine derivatives are exemplified.

The nonionic surfactant for use in the developer is not particularly limited and includes, for example, polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide addacts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Of the compounds, those having an aromatic ring and an ethylene oxide chain are preferred, and alkyl-substituted or unsubstituted phenol ethylene oxide adducts and alkyl-substituted or unsubstituted naphthol ethylene oxide adducts are more preferred.

The amphoteric surfactant for use in the developer is not particularly limited and includes, for instance, amine oxide type, for example, alkyldimethylamine oxide, betaine type, for example, alkyl betaine and amino acid type, for example, sodium salt of alkylamino fatty acid. In particular, an alkyldimethylamine oxide which may have a substituent, an alkyl carboxy betaine which may have a substituent and an alkyl sulfo betaine which may have a substituent are preferably used. Specific examples of the compound are described, for example, in Paragraph Nos. [0255] to [0278] of JP-A-2008-203359 and Paragraph Nos. [0028] to [0052] of JP-A-2008-276166. Specific examples of the more preferable compound include 2-alkyl-N-carboxymethyl-N-hydroxyethyl imidazolinium betaine, alkyldiaminoethylglycine hydrochloride, lauryldimethylaminoacetic acid betaine, N-lauric acid amidopropyldimethyl betaine and N-lauric acid amidopropyldimethylamine oxide.

Two or more surfactants may be used in combination. The content of the surfactant in the developer is preferably from 0.01 to 20% by weight, and more preferably from 0.1 to 10% by weight.

The water-soluble polymer for use in the developer having pH from 2 to 11 includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, known soybean polysaccharide can be used. For example, as a commercial product, SOYAFIVE (trade name, produced by Fuji Oil Co., Ltd.) is available and various grade products can be used. The soybean polysaccharide preferably used is that having viscosity in a range from 10 to 100 mPa/sec in the 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more water-soluble polymer compounds may be used in combination. The content of the water-soluble polymer in the developer is preferably from 0.1 to 20% by weight, and more preferably from 0.5 to 10% by weight.

Into the developer having pH from 2 to 11 for use in the invention, a pH buffer agent may further be incorporated.

As the pH buffer agent used in the invention, a pH buffer agent exhibiting a pH buffer function at pH from 2 to 11 is used without particular restriction. In the invention, a weak alkaline buffer agent is preferably used and includes, for example, (a) a carbonate ion and a hydrogen carbonate ion, (b) a borate ion, (c) a water-soluble amine compound and an ion of the water-soluble amine compound, and combinations thereof. Specifically, for example, (a) a combination of a carbonate ion and a hydrogen carbonate ion, (b) a borate ion, or (c) a combination of a water-soluble amine compound and an ion of the water-soluble amine compound exhibits a pH buffer function in the developer to prevent fluctuation of the pH even when the developer is used for a long period of time. As a result, for example, the deterioration of developing property resulting from the fluctuation of pH and the occurrence of development scum are restrained. The combination of a carbonate ion and a hydrogen carbonate ion is particularly preferred.

In order for a carbonate ion and a hydrogen carbonate ion to be present in the developer, a carbonate and a hydrogen carbonate may be added to the developer or a carbonate ion and a hydrogen carbonate ion may be generated by adding a carbonate or a hydrogen carbonate to the developer and then adjusting the pH. The carbonate or hydrogen carbonate used is not particularly restricted and it is preferably an alkali metal salt thereof. Examples of the alkali metal include lithium, sodium and potassium and sodium is particularly preferable. The alkali metals may be used individually or in combination of two or more thereof.

When the combination of (a) a carbonate ion and a hydrogen carbonate ion is adopted as the pH buffer agent, the total amount of the carbonate ion and hydrogen carbonate ion is preferably from 0.05 to 5 mole/l, more preferably from 0.1 to 2 mole/l, particularly preferably from 0.2 to 1 mole/l, in the developer.

The developer may contain an organic solvent. As the organic solvent to be contained, for example, an aliphatic hydrocarbon (e.g., hexane, heptane, Isopar E, Isopar H, Isopar G (produced by Esso Chemical Co., Ltd.)), an aromatic hydrocarbon (e.g., toluene or xylene), a halogenated hydrocarbon (methylene dichloride, ethylene dichloride, trichlene or monochlorobenzene) or a polar solvent is exemplified. Examples of the polar solvent include an alcohol (e.g., methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide or N-methylpyrrolidone).

Two or more organic solvents may be used in the developer.

Further, when the organic solvent is insoluble in water, it may be employed by being solubilized in water using a surfactant or the like. In the case where the developer contains an organic solvent, the concentration of the organic solvent is desirably less than 40% by weight in view of safety and inflammability.

The developer having pH from 2 to 11 may contain a preservative, a chelating agent, a defoaming agent, an organic acid, an inorganic acid, an inorganic salt or the like in addition the components described above. Specifically, compounds described in Paragraph Nos. [0266] to [0270] of JP-A-2007-206217 are preferably used.

The developer described above can be used as a developer and a development replenisher for the exposed lithographic printing plate precursor and it is preferably applied to an automatic processor described hereinafter. In the case of conducting the development processing using an automatic processor, the processing solution becomes fatigued in accordance with the processing amount, and hence the processing ability may be restored using a replenisher or a fresh developer.

The development processing using the developer having pH from 2 to 11 according to the invention is preferably performed by an automatic processor equipped with a supplying means for the developer and a rubbing member. An automatic processor using a rotating brush roll as the rubbing member is particularly preferred. Further, the automatic processor is preferably provided with a means for removing the excess developer, for example, a squeeze roller or a drying means, for example, a hot air apparatus, subsequently to the development processing means.

Further, in the plate making process of preparing a lithographic printing plate from the lithographic printing plate precursor according to the invention, the lithographic printing plate precursor may be heated its entire surface before or during the exposure or between the exposure and the development, if desired. By the heating, the image-forming reaction in the image-recording layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise sometimes in that the unexposed area is also cured. On the other hand, the heating after the development can be performed using very strong conditions. Ordinarily, the heat treatment is carried out in a temperature range from 100 to 500° C. When the temperature is too low, a sufficient effect of strengthening the image may not be obtained, whereas when it is excessively high, problems of deterioration of the support and thermal decomposition of the image area may occur sometimes.

<Image Exposure>

In advance of the above-described development processing, the lithographic printing plate precursor is imagewise exposed with laser through a transparent original having a line image, a halftone dot image or the like, or imagewise exposed, for example, by scanning of laser beam based on digital data.

The wavelength of the exposure light source is preferably from 350 to 450 nm or from 750 to 1,400 nm. In case of exposing with light of 350 to 450 nm, the lithographic printing plate precursor having an image-recording layer containing a sensitizing dye having an absorption maximum in such a wavelength range is used. In case of exposing with light of 750 to 1,400 nm, the lithographic printing plate precursor containing an infrared absorbing agent which is a sensitizing dye having an absorption maximum in such a wavelength range is used. As the light source of 350 to 450 nm, a semiconductor laser is preferably used. As the light source of 750 to 1,400 nm, a solid laser or semiconductor laser emitting an infrared ray is preferably used. The exposure mechanism may be any of an internal drum system, an external drum system and a flat bed system.

With respect to the infrared ray laser, the output is preferably 100 mW or more, the exposure time per pixel is preferably within 20 microseconds, and the irradiation energy is preferably from 10 to 300 $mJ/cm^2$.

With respect to the laser exposure, in order to reduce the exposure time, it is preferred to use a multibeam laser device.

In case of the lithographic printing plate precursor requiring development processing with a developer, the lithographic printing plate precursor is imagewise exposed and subjected to development processing to prepare a lithographic printing plate and the resulting lithographic printing plate is mounted on a plate cylinder of a printing machine to conduct printing.

In case of the lithographic printing plate precursor of on-press development type, the lithographic printing plate precursor is imagewise exposed and then mounted as it is on a plate cylinder of a printing machine to initiate printing. In case of using a printing machine equipped with a laser exposure apparatus, the lithographic printing plate precursor is mounted on a plate cylinder of the printing machine and then subjected to the imagewise exposure.

[In Case of Using in Antifouling Member or Antifogging Member]

The antifouling member or antifogging member according to the invention means a member provided with a polymerized cured film having good antifouling property or antifogging property obtained by polymerization and curing of the polymerizable composition according to the invention. The polymerized cured film obtained by polymerization and curing of the polymerizable composition according to the invention is a crosslinked film and due to the formation of hydrogen bonds between the urea structures the cured film has high strength so that the cured film is hardly swellable with water and has high scratch resistance in spite of containing the highly hydrophilic component. Therefore, the member having the polymerized cured film can be used as an antifouling member or antifogging member. Preferred embodiments and types of usage thereof will be described below.

<Antifouling Member>

Since the polymerized cured film obtained from the polymerizable composition according to the invention has the high hydrophilicity and durability thereof, the formation of cured film on a surface of member can prevent adhesion of oily stain on the surface of member. Specifically, due to the high surface hydrophilicity thereof the oily stain caused by the use of a person, for example, fingerprints, sebum, sweat or cosmetics or the oily stain arising from a plant or cooking equipment hardly adheres on the surface thereof or even when it adheres, it can be easily removed, for example, by wiping or washing with water.

The antifouling member according to the invention can be obtained by coating the polymerizable composition on an appropriate substrate, drying and then exposing to light to make the coated film a cured film.

Ordinary applications of the antifouling member according to the invention include the use on a surface of an optical element, for example, an antireflective film, an optical filter, an optical lens, a lens for spectacles or a mirror.

The substrate used for the polymerized cured film according to the invention is not particularly restricted and any substrate can be used as far as the polymerized cured film according to the invention can be formed.

For instance, in case of using in the optical element, a transparent substrate is preferred and as for the material thereof an inorganic substrate, for example, glass or a glass plate provided with an inorganic compound layer formed, for example, from a metal oxide, for example, titanium oxide or ITO (indium tin oxide) or a metal halide, for example, magnesium fluoride or potassium fluoride, a visible light permeable plastic substrate of resin, for example, a polyolefin resin, for example, polyethylene or polypropylene, a polyester resin, for example, polyethylene terephthalate or polyethylene naphthalate, a polyimide resin, polystyrene, polyvinyl chloride, polyimide, polyvinyl alcohol, polyethylene vinyl alcohol, an acrylic resin or a cellulose resin, for example, triacetyl cellulose, diacetyl cellulose or cellophane, and a transparent plastic plate having the inorganic compound layer same as that laminated on the glass plate are preferably utilized.

The substrate to which the polymerizable composition according to the invention is applied is described in detail in Paragraph Nos. [0029] to [0036] of JP-A-2003-206472 previously proposed by the present applicant and the substrate described can be used as a substrate for forming the crosslinked hydrophilic film according to the invention.

Further, prior to the coating of the polymerizable composition solution on the substrate, if desired, the surface of substrate may be subjected to surface treatment or an undercoat layer may be provided on the substrate. The methods for the surface treatment and undercoating include those described in JP-A-2009-256575.

The polymerizable composition film obtained by coating on the substrate is subjected to light irradiation to make a polymerized cured film having durability, thereby preparing the antifouling member. A light source for the light irradiation includes, for example, an ultrahigh pressure mercury lamp, a high pressure mercury lamp, a medium pressure mercury lamp, a metal halide lamp, a xenon lamp and various lasers. The light irradiation is preferably conducted under a nitrogen gas atmosphere or under a reduced pressure or in vacuum, although it may be conducted in the atmosphere. As for the member prepared from the polymerizable composition according to the invention, the substrate having the polymerized cured film is immersed in ion-exchanged water, washed and dried at about 100° C. for one minute to accelerate the formation of crosslinked structure in the polymerized cured film.

The thickness of the hydrophilic cured film is preferably from 0.1 to 10 μm and more preferably from 0.1 to 5 μm. The range described above is preferred because the hydrophilicity is sufficiently exerted without the generation of defect, for example, drying unevenness.

Examples of the usage to which the antifouling member according to the invention is applicable include a mirror, for example, a rearview mirror of car, a mirror for bathroom, a washstand mirror, a dental mirror or a road mirror, a lens, for example, a lens for spectacles, an optical lens, a camera lens, an endoscope lens, a lens for lighting equipment, a lens for semiconductor equipment or a copier lens, a prism, and a cathode-ray tube, and as the usage other than the optical element, a windowpane of building or lookout tower, a windowpane of conveyance, for example, an automobile, a rail car, an aircraft, a ship, a submarine, a snowmobile, a ropeway gondola, an amusement park gondola or a spacecraft, a windshield of conveyance, for example, an automobile, a rail car, an aircraft, a ship, a submarine, a snowmobile, a motorcycle, a ropeway gondola, an amusement park gondola or a spacecraft, a protective goggle, a sporting goggle, a protective mask shield, a sport mask shield, a helmet shield, a glass of frozen foods showcase, a cover glass for measurement instrument, and a film to be stuck to the surface of the articles described above.

When it is intended to apply the antifouling member to a substrate which does not require transparency, any of metal, ceramic, wood, stone, cement, concrete, fiber, fabric, a combination of these materials or a laminate of these materials can be preferably utilized as the substrate in addition to the transparent substrate described above. Examples of the usage to which the antifouling member according to the invention is applicable include a building material, an exterior of building, an interior of building, a window frame, a windowpane, a structural member, an exterior or coating of conveyance, an exterior of mechanical device or article, a dustproof cover or coating, a traffic sign, various display devices, an advertising tower, a road soundproof wall, a railroad soundproof wall, a bridge, an exterior or coating of guardrail, an interior or coating of tunnel, an insulator, a solar cell cover, a heat collecting cover of solar water heater, a vinyl house, a panel lamp cover of vehicle, a household equipment, a lavatory basin, a bathtub, a washstand, a lighting equipment, a lighting cover, a kitchen ware, a dish, a dish washer, a dish drier, a sink, a kitchen range, a kitchen hood, a ventilating fan, a film to be stuck to the surface of the articles described above, a housing, part, exterior or coating of home appliance, a housing, part, exterior or coating of office automation equipment, and a film to be stuck to the surface of the articles described above.

<Antifogging Member>

Since the member having the polymerized cured film according to the invention has the high hydrophilicity and durability thereof on its surface, the surface of member can effectively prevent adhesion of water droplet due to dew condensation and the member is useful as an antifogging member. Specifically, even when water vapor in the atmosphere builds up condensation to adhere on the surface due to the influence of temperature or humidity, the dew condensation rapidly diffuses without the formation of water droplet on the surface thereby inhibiting fogging on the surface.

Therefore, the member according to the invention can be preferably used as the antifogging member for an optical element, for example, an antireflective film, an optical filter, an optical lens, a lens for spectacles or a mirror, or a windowpane, glass for conveyance or the like which requires visibility.

The substrate which can be applied to the antifogging member is same as that described as for the antifouling member above. The usage is also same as that described as for the antifouling member above. In the embodiments recited as the usage of the antifouling member, the present invention can be preferably used in the member which requires not only prevention of the adhesion of oily stain but also prevention of the dew condensation by the high hydrophilicity.

EXAMPLES

The present invention will be described in more detail with reference to the following examples, but the invention should not be construed as being limited thereto. In the examples, a molecular weight of polymer compound is expressed as a weight average molecular weight (Mw). A ratio of repeating unit of the specific polymer compound according to the invention and a comparative polymer compound is expressed in molar percentage, and a ratio of repeating unit of other polymer compound is expressed in molar percentage.

Synthesis Example of Specific Polymer Compound

Synthesis Example 1

Synthesis of Specific Polymer Compound (33)

(1) Synthesis of N-aminoethylmethacrylamide

In a mixture of 100 ml of methanol and 96 g of distilled water was dissolved 24.04 g (0.4 mol) of ethylenediamine and to the solution was added 104 g (0.52 mol) of 5.0 M hydrochloric acid while cooling with ice. To the mixture was dropwise added 61.65 g of methacrylic anhydride while maintaining at −10° C. and after the completion of the dropwise addition, the mixture was stirred at −10° C. for 2 hours. Then, 400 ml of ethyl acetate was added to the mixture to conduct extraction and the aqueous layer was collected. To the aqueous layer was added 21 g (0.52 mol) of sodium hydroxide, the white crystals deposited were removed by filtration, and extraction treatment was conducted with 400 ml of acetonitrile. The acetonitrile solution was dried on 40 g of magnesium sulfate for 2 hours and the acetonitrile was distilled off to obtain 14.4 g (yield: 28%) of N-aminoethylmethacrylamide.

(2) Synthesis of 4-sulfonatobutyl[3-(methacryloylamino)propyl]dimethylammonium

In 380 ml of acetonitrile were dissolved 130 g (0.764 mol) of N-[3-(dimethylamino)propyl]methacrylamide, 104 g of butanesultone and 234 mg of 4-hydroxy-2,2,6,6-tetramethylpiperidinoxy and the solution was heated at 70° C. for 6 hours. After allowing to cooling, to the reaction mixture were added 1,350 ml of acetone and 150 ml of methanol and the mixture was stirred at room temperature for one hour. The crystals deposited were collected by filtration and thoroughly washed with acetone to obtain 200.0 g (yield: 85%) of 4-sulfonatobutyl[3-(methacryloylamino)propyl]dimethylammonium.

(3) Polymerization Step

To a 500 ml flask equipped with a condenser and a stirrer was charged 87.4 g of distilled water and heated to 55° C. under nitrogen stream. A solution composed of 2.56 g of N-aminoethylmethacrylamide synthesized above, 24.51 g of 4-sulfonatobutyl[3-(methacryloylamino)propyl]dimethylammonium synthesized above, 10.01 g of methyl methacrylate (produced by produced by Wako Pure Chemical Industries, Ltd.), 0.965 g of a polymerization initiator (VA046B, produced by Wako Pure Chemical Industries, Ltd.) and 87.4 g of distilled water was dropwise added to the distilled water in the 500 ml flask over a period of 2 hours. After the completion of the dropwise addition, the mixture was stirred at 55° C. for 2 hours, 0.965 g of a polymerization initiator (VA046B, produced by Wako Pure Chemical Industries, Ltd.) was added thereto and further stirred at 55° C. for 2 hours to obtain a precursor of Specific polymer compound (33).

To the precursor of Specific polymer compound (33) was added 33.51 g of KARENZ MOI (produced by Showa Denko K.K.) was added thereto and the mixture was stirred at 40° C. for 6 hours. Then, the white crystals deposited were removed by filtration to obtain Specific polymer compound (33). A weight average molecular weight (Mw) of Specific polymer compound (33) thus-obtained was measured by a gel permeation chromatography (GPC) method using polyethylene glycol as a standard substance and found to be 100,000.

Specific polymer compounds (31), (32) and (34) to (68) used in the examples were synthesized by changing the monomer component for repeating unit and the amount of the polymerization initiator (VA046B) in the synthesis examples described above and further using an existing synthesis method, if desired.

Also, the structure of Comparative polymer compounds (R-1) to (R-6) used in the comparative examples are shown below.

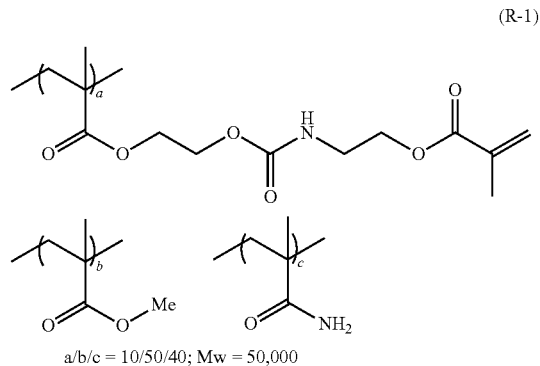

a/b/c = 10/50/40; Mw = 50,000

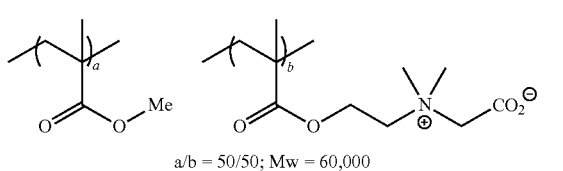

a/b = 50/50; Mw = 60,000

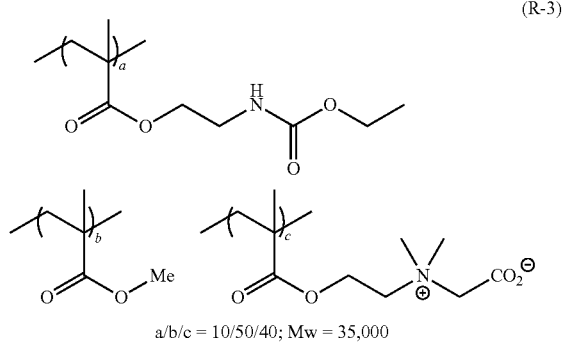

a/b/c = 10/50/40; Mw = 35,000

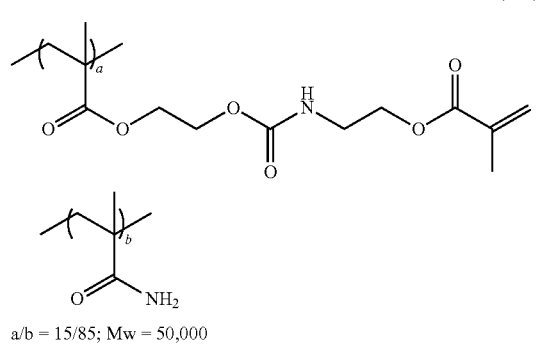

a/b = 15/85; Mw = 50,000

(R-5)

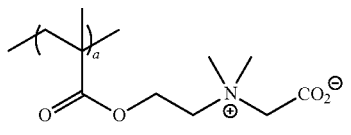

a = 100; Mw = 80,000

(R-6)

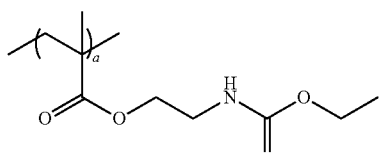

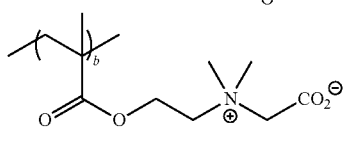

a/b = 15/85; Mw = 75,000

Examples 1 to 20 and Comparative Examples 1 to 3

Preparation and Evaluation of Lithographic Printing Plate Precursors (1) to (20) and (R-1) to (R-3)

(1) Preparation of Support

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was then subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm$^2$ to form a direct current anodized film of 2.5 g/m$^2$, washed with water and dried to prepare Support (1).

Thereafter, in order to ensure the hydrophilicity of the non-image area, Support (1) was subjected to silicate treatment using a 2.5% by weight aqueous sodium silicate No. 3 solution at 60° C. for 10 seconds and subsequently washed with water to obtain Support (2). The adhesion amount of Si was 10 mg/m$^2$. The center line average roughness (Ra) of Support (2) was measured using a stylus having a diameter of 2 μm and found to be 0.51 μm.

(2) Formation of Undercoat Layer

Coating solution (1) for undercoat layer having the composition shown below was coated on Support (2) described above so as to have a dry coating amount of 20 mg/m$^2$ to prepare a support having an undercoat layer.

<Coating Solution (1) for Undercoat Layer>

| | |
|---|---|
| Compound (1) for undercoat layer having structure shown below | 0.18 g |
| Hydroxyethyliminodiacetic acid | 0.10 g |
| Methanol | 55.24 g |
| Water | 6.15 g |

Compound (1) for undercoat layer:

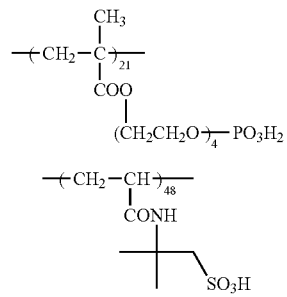

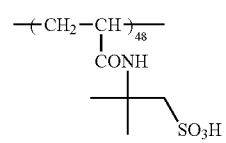

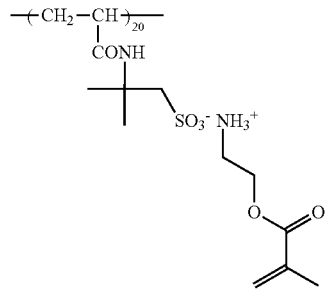

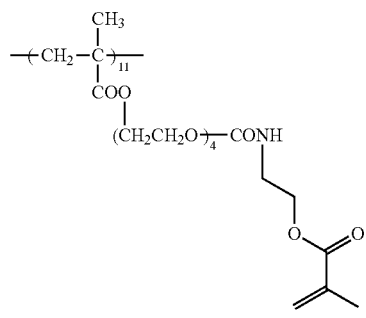

Mw: 100,000

(3) Formation of Image-Recording Layer

Coating solution (1) for image-recording layer having the composition shown below was coated on the undercoat layer formed as described above by a bar and dried in an oven at 100° C. for 60 seconds to form an image-recording layer having a dry coating amount of 1.0 g/m².

Coating solution (1) for image-recording layer was prepared by mixing Photosensitive solution (1) shown below with Microgel solution (1) shown below just before the coating, followed by stirring.

<Photosensitive Solution (1)>

| | |
|---|---|
| Specific polymer compound or comparative polymer compound shown in Table 1 | 0.240 g |
| Infrared absorbing dye (1) having structure shown below | 0.030 g |
| Polymerization initiator (1) having structure shown below | 0.162 g |
| Radical polymerizable compound (Tris(acryloyloxyethyl) isocyanurate (NK ESTER A-9300, produced by Shin-Nakamura Chemical Co., Ltd.)) | 0.192 g |
| Hydrophilic low molecular weight compound (Tris(2-hydroxyethyl) isocyanurate) | 0.062 g |
| Hydrophilic low molecular weight compound (1) having structure shown below | 0.050 g |
| Oil-sensitizing agent (Phosphonium compound (1) having structure shown below) | 0.055 g |
| Oil-sensitizing agent (Benzyl dimethyl octyl ammonium $PF_6$ salt) | 0.018 g |
| Oil-sensitizing agent (Ammonium group-containing polymer having structure shown below (reduced specific viscosity: 44 cSt/g/ml) | 0.035 g |
| Fluorine-based surfactant (1) having structure shown below | 0.008 g |
| 2-Butanone | 1.091 g |
| 1-Methoxy-2-propanol | 8.609 g |

<Microgel Solution (1)>

| | |
|---|---|
| Microgel (1) shown below | 2.640 g |
| Distilled water | 2.425 g |

The structures of Infrared absorbing dye (1), Polymerization initiator (1), Phosphonium compound (I), Hydrophilic low molecular weight compound (I), Oil-sensitizing agent (ammonium group-containing polymer) and Fluorine-based surfactant (1) are shown below.

Ammonium group-containing polymer:

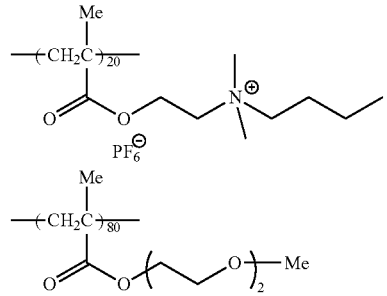

Infrared absorbing dye (1):

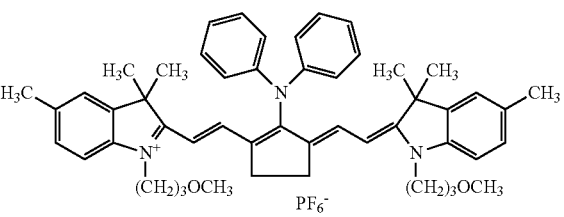

Polymerization initiator (1):

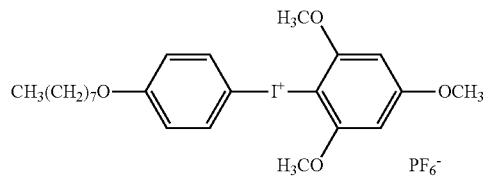

Fluorine-based surfactant (1):

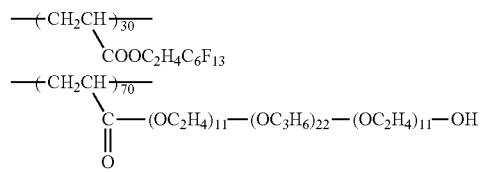

Hydrophilic low molecular weight compound (1):

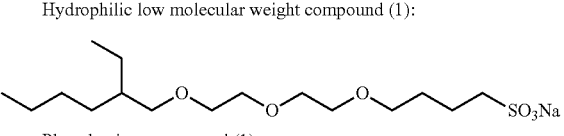

Phosphonium compound (1):

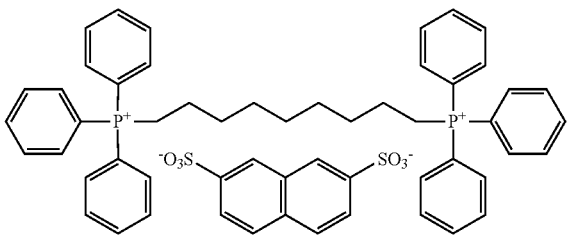

<Preparation of Microgel (1)>

An oil phase component was prepared by dissolving 10 g of adduct of trimethylol propane and xylene diisocyanate (TAKENATE D-110N, produced by Mitsui Chemicals Polyurethanes, Inc.), 3.15 g of pentaerythritol triacrylate (SR444, produced by Nippon Kayaku Co., Ltd.) and 0.1 g of PIONIN A-41C (produced by Takemoto Oil & Fat Co., Ltd.) in 17 g of ethyl acetate. As an aqueous phase component, 40 g of a 4% by weight aqueous solution of polyvinyl alcohol (PVA-205, produced by Kuraray Co., Ltd.) was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid content concentration of 15% by weight to prepare Microgel (1). The average particle size of the microgel was measured by a light scattering method and found to be 0.2 µm.

(4) Formation of Protective Layer

Coating solution (1) for protective layer having the composition shown below was coated on the image-recording layer described above by a bar and dried in an oven at 120° C. for 60 seconds to form a protective layer having a dry coating amount of 0.15 g/m², thereby preparing Lithographic printing plate precursors (1) to (20) for Examples 1 to 20 and Lithographic printing plate precursors (R-1) to (R-3) for Comparative Examples 1 to 3, respectively.

<Coating Solution (1) for Protective Layer>

| | |
|---|---|
| Dispersion of inorganic stratiform compound (1) shown below | 1.5 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.55 g |
| Aqueous 6% by weight solution of polyvinyl alcohol (PVA-405, saponification degree: 81.5 % by mole, polymerization degree: 500, produced by Kuraray Co., Ltd.) | 0.03 g |
| Aqueous 1% by weight solution of surfactant (EMALEX 710, produced by Nihon Emulsion Co., Ltd.) | 0.86 g |
| Ion-exchanged water | 6.0 g |

<Preparation of Dispersion of Inorganic Stratiform Compound (1)>

To 193.6 g of ion-exchanged water was added 6.4 g of synthetic mica (SOMASIF ME-100, produced by CO—OP Chemical Co., Ltd.) and the mixture was dispersed using a homogenizer until an average particle size (according to a laser scattering method) became 3 µm to prepare Dispersion of inorganic stratiform compound (I). The aspect ratio of the inorganic particle thus-dispersed was 100 or more.

(5) Evaluation

Each of the lithographic printing plate precursors thus-obtained was exposed by LUXEL PLATESETTER T-6000III equipped with an infrared semiconductor laser, produced by FUJIFILM Corp. under the conditions of a rotational number of an external drum of 1,000 rpm, laser output of 70% and resolution of 2,400 dpi. The exposed image contained a solid image and a 50% halftone dot chart of a 20 µm-dot FM screen.

The exposed lithographic printing plate precursor was mounted without undergoing development processing on a plate cylinder of a printing machine (LITHRONE 26, produced by Komori Corp.). Using dampening water (ECOLITY-2 (produced by FUJIFILM Corp.)/tap water=2/98 (volume ratio)) and VALUES-G (N) Black Ink (produced by Dainippon Ink & Chemicals, Inc.), the dampening water and ink were supplied according to the standard automatic printing start method of LITHRONE 26 to conduct printing on Tokubishi art paper (76.5 kg) at a printing speed of 10,000 sheets per hour.

<On-Press Development Property>

A number of the printing papers required until the on-press development of the unexposed area of the image-recording layer on the printing machine was completed to reach a state where the ink was not transferred to the printing paper in the non-image area was measured to evaluate the on-press development property. The results obtained are shown in Table 1.

<On-Press Development Property after Passage of Time>

The lithographic printing plate precursor obtained was allowed to stand in a temperature and humidity controlled chamber set at temperature of 60° C. and relative humidity of 60% for 4 days and then subjected to the exposure, on-press development and printing in the same manner as described above. A number of the printing papers required until the on-press development of the unexposed area of the image-recording layer on the printing machine was completed to reach a state where the ink was not transferred to the printing paper in the non-image area was measured to evaluate the on-press development property. The results obtained are shown in Table 1.

<Printing Durability>

After performing the evaluation for the on-press development property described above, the printing was continued. As the increase in a number of printing papers, the image-recording layer was gradually abraded to cause decrease in the ink density on the printing paper. A number of printing papers wherein a value obtained by measuring a halftone dot area rate of the 50% halftone dot of FM screen on the printing paper using a Gretag densitometer decreased by 5% from the value measured on the 100th paper of the printing was determined to evaluate the printing durability.

TABLE 1

Examples 1 to 20 and Comparative Examples 1 to 3 (Lithographic Printing Plate Precursor)

| | Lithographic Printing Plate Precursor | Specific Polymer Compound | On-press Development Property (sheets) | | Printing Durability (sheets) |
|---|---|---|---|---|---|
| | | | Just after Preparation | After Passage of Time | |
| Example 1 | (1) | (31) | 15 | 30 | 40,000 |
| Example 2 | (2) | (32) | 15 | 30 | 50,000 |
| Example 3 | (3) | (33) | 20 | 40 | 52,000 |
| Example 4 | (4) | (34) | 25 | 45 | 53,000 |
| Example 5 | (5) | (35) | 30 | 50 | 54,000 |
| Example 6 | (6) | (36) | 35 | 60 | 55,000 |
| Example 7 | (7) | (37) | 15 | 30 | 48,000 |
| Example 8 | (8) | (38) | 25 | 50 | 60,000 |
| Example 9 | (9) | (39) | 30 | 60 | 60,000 |
| Example 10 | (10) | (40) | 20 | 40 | 50,000 |

TABLE 1-continued

Examples 1 to 20 and Comparative Examples 1 to 3 (Lithographic Printing Plate Precursor)

| | Lithographic Printing Plate Precursor | Specific Polymer Compound | On-press Development Property (sheets) | | Printing Durability (sheets) |
|---|---|---|---|---|---|
| | | | Just after Preparation | After Passage of Time | |
| Example 11 | (11) | (41) | 20 | 40 | 50,000 |
| Example 12 | (12) | (42) | 40 | 70 | 50,000 |
| Example 13 | (13) | (43) | 40 | 80 | 50,000 |
| Example 14 | (14) | (44) | 18 | 33 | 52,000 |
| Example 15 | (15) | (45) | 20 | 35 | 52,000 |
| Example 16 | (16) | (46) | 17 | 35 | 48,000 |
| Example 17 | (17) | (47) | 20 | 35 | 50,000 |
| Example 18 | (18) | (48) | 20 | 35 | 50,000 |
| Example 19 | (19) | (49) | 20 | 35 | 50,000 |
| Example 20 | (20) | (50) | 30 | 50 | 50,000 |
| Comparative Example 1 | (R-1) | (R-1) | 60 | 100 | 35,000 |
| Comparative Example 2 | (R-2) | (R-2) | 20 | 40 | 10,000 |
| Comparative Example 3 | (R-3) | (R-3) | 20 | 40 | 20,000 |

As is apparent from the results shown in Table 1, it can be seen that the lithographic printing plate precursors of Examples 1 to 20 exhibit the excellent printing durability. On the contrary, as for the lithographic printing plate precursors in which the polymer compound different from that of the present invention is used, the printing durability is at an insufficient level.

Examples 21 to 38 and Comparative Examples 4 to 6

Preparation and Evaluation of Antifouling Member and Antifogging Member

A polymerized cured film was prepared from the polymerizable composition according to the invention and evaluated for the antifouling agent or antifogging agent.
[Preparation of Polymerized Cured Film]
Polymerizable composition solution (1) shown below was coated on a glass plate
(produced by Endo Scientific Instrument Co., Ltd.) as a support so as to have a coating amount after drying of 1 g/m² and dried by heating at 120° C. for 2 minutes to from a polymerizable composition film on the support. The support having the polymerizable composition film formed thereon was put into a vat and the upper part of the vat was sealed with F.O.R. WRAP produced by Riken Technos Corp., the air inside the wrap was substituted with nitrogen gas, and the irradiation was conducted using a 400 W high pressure mercury lamp (UVL-400P produced by Riko Kagaku Sangyo Co., Ltd.) for 10 minutes. The support having a polymerized cured film thereon thus-obtained was immersed in ion exchanged water to conduct washing and dried at 100° C. for one minute to accelerate formation of crosslinked structure in the polymerized cured film, whereby a polymerized cured film for the antifouling member or antifogging member used in each of Examples 21 to 38 and Comparative Examples 4 to 6.
Polymerizable Composition Solution (1)

| | |
|---|---|
| Specific polymer compound or comparative polymer compound shown in Table 2 | 4 g |
| Ethoxylated trimethylolpropane triacrylate (SR-9035, produced by Nippon Kayaku Co., Ltd.) | 2.7 g |
| IRGACURE 2959 (produced by Ciba Specialty Chemicals Inc.) | 0.5 g |
| Water | 100 g |

[Evaluation for Antifouling Agent or Antifogging Agent]
(1) Evaluation of Abrasion Resistance
The surface of the member for each of Examples 21 to 38 and Comparative Examples 4 to 6 was rubbed 100 times with nonwoven fabric (BEMCOT, produced by Asahi Kasei Fibers Corp.). Contact angles (water droplet in air contact angles) before and after the rubbing were measured using DROP-MASTER 500 (produced by Kyowa Interface Science Co., Ltd.) and the change in the contact angles was evaluated according to the criteria shown below. The results obtained are shown in Table 2 below.
A: Change in the contact angles before and after the rubbing was not more than 1 degree.
B: Change in the contact angles before and after the rubbing was more than 1 degree but not more than 2 degrees.
C: Change in the contact angles before and after the rubbing was more than 2 degrees.
It is evaluated that as the change in the contact angles before and after the rubbing is smaller, the hydrophilicity is less degraded and the durability is more excellent.
(2) Evaluation of Water Resistance
The surface of the member was subjected to a reciprocal rubbing treatment of 10 times with a sponge under a load of one kg in water and a remaining film rate was determined from the change in weight before and after the rubbing treatment. The water resistance was evaluated according to the remaining film rate.
A: The remaining film rate was not less than 80%.
B: The remaining film rate was less than 80% but not less than 60%.
C: The remaining film rate was less than 60%.
(3) Evaluation of Antifogging Property
The member was exposed to water vapor for one minute and after separating from the water vapor, it was placed under the circumstances of 25° C. and 10% RH and the degree of fogging on the surface of the member and the change thereof were observed to evaluate at three levels according to the criteria shown below. The treatment and observation were performed under a fluorescent lamp in a room. The results obtained are shown in Table 2 below.
A: The fogging was not observed.
B: The fogging was observed but disappeared within 10 seconds.
C: The fogging was observed and did not disappear after the passage of 10 seconds.
(4) Evaluation of Antifouling Property A line was drawn on the surface of the member with oily ink (oily marker produced by Mitsubishi Pencil Co., Ltd.) and then water was continuously poured thereon to conduct sensory evaluation of removal of the ink according to the criteria shown below. The results obtained are shown in Table 2 below.
A: The ink was removed within one minute.
B: The ink was removed after the passage of one minute.
C: The ink was not removed after the passage of 10 minute.

TABLE 2

Examples 21 to 38 and Comparative Examples 4 to 6
(Antifouling or Antifogging Member)

|  | Specific Polymer Compound | Abrasion Resistance | Water Resistance | Antifogging Property | Antifouling Property |
|---|---|---|---|---|---|
| Example 21 | (51) | B | B | A | A |
| Example 22 | (52) | A | A | A | A |
| Example 23 | (53) | A | A | A | A |
| Example 24 | (54) | A | A | A | A |
| Example 25 | (55) | A | A | A | A |
| Example 26 | (56) | A | A | B | B |
| Example 27 | (57) | A | A | B | B |
| Example 28 | (58) | B | B | A | A |
| Example 29 | (59) | A | A | A | A |
| Example 30 | (60) | A | A | A | A |
| Example 31 | (61) | A | A | A | A |
| Example 32 | (62) | A | A | A | A |
| Example 33 | (63) | A | A | A | A |
| Example 34 | (64) | A | A | B | B |
| Example 35 | (65) | A | A | B | B |
| Example 36 | (66) | A | A | A | A |
| Example 37 | (67) | A | A | A | A |
| Example 38 | (68) | A | A | A | A |
| Comparative Example 4 | (R-4) | C | C | C | C |
| Comparative Example 5 | (R-5) | C | C | B | B |
| Comparative Example 6 | (R-6) | C | C | C | C |

As is apparent from the results shown in Table 2, it can be seen that the members of Examples 21 to 38 are excellent in the hydrophilicity of the surface and the durability thereof, can prevent the adhesion of oily stain and the fogging arising from the adhesion of water droplet, have the excellent surface antifouling property and antifogging property and have the sufficient practical performance as the antifouling member or antifogging member. On the contrary, as for the members of Comparative Examples 4 to 6 in which the hydrophilic polymer outside the scope of the present invention is used, the abrasion resistance of surface hydrophilicity is poor and they are practically at an insufficient level as the antifouling member or antifogging member.

This application is based on Japanese Patent application JP 2010-195226, filed Aug. 31, 2010, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:
1. A lithographic printing plate precursor comprising a support and an image-recording layer comprising a polymerizable composition comprising:
(A) a polymer compound comprising (a1) a repeating unit having a structure represented by the following formula (a1-1) in a side chain thereof; and
(B) a polymerization initiator,

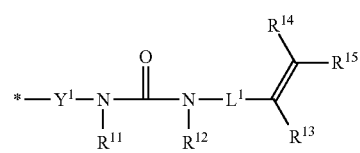

(a1-1)

wherein $R^{11}$ and $R^{12}$ each independently represents a hydrogen atom, an alkyl group, an aryl group, a heterocyclic group, a sulfo group, an alkylsulfonyl group, a arylsulfonyl group, an acyl group, an aryloxycarbonyl group, an alkoxycarbonyl group or a carbamoyl group, $R^{13}$, $R^{14}$ and $R^{15}$ each independently represents a hydrogen atom, an alkyl group or an aryl group, $L^1$ represents a divalent connecting group, $Y^1$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound;
wherein the polymer compound (A) further comprises (a2) a repeating unit having a zwitter ion structure represented by the following formula (a2-1) or (a2-2) in a side chain thereof:

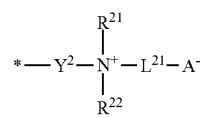

(a2-1)

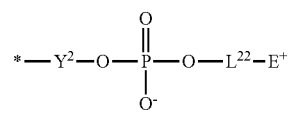

(a2-2)

wherein, in the formula (a2-1), $R^{21}$ and $R^{22}$ each independently represents a hydrogen atom, an alkyl group, an alkenyl group, an alkynyl group, an aryl group or a heterocyclic group, or $R^{21}$ and $R^{22}$ may be combined with each other to from a ring structure, $L^{21}$ represents a divalent connecting group, $A^-$ represents a structure having an anion, $Y^2$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound; in the formula (a2-2), $L^{22}$ represents a divalent connecting group, $E^+$ represents a structure having a cation, $Y^2$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

2. The lithographic printing plate precursor as claimed in claim 1, wherein the image-recording layer is capable of being removed with at least any of printing ink and dampening water.

3. The lithographic printing plate precursor as claimed in claim 1, wherein the side chain having a zwitter ion structure in the repeating unit (a2) has a structure represented by the formula (a2-1) and in the formula (a2-1), A" represents a sulfonate.

4. The lithographic printing plate precursor as claimed in claim 1, which further comprises a sensitizing dye.

5. The lithographic printing plate precursor as claimed in claim 1, which further comprises a polymerizable compound.

6. The lithographic printing plate precursor as claimed in claim 1, wherein $Y^1$ in the formula (a1-1) represents a divalent connecting group of one of the following L1, L2, L3, or L4:
L1: —CO—O-divalent aliphatic group-
L2: —CO—O-divalent aromatic group-
L3: —CO—NH-divalent aliphatic group-
L4: —CO—NH-divalent aromatic group-
wherein the left side of each of L1 to L4 connects to the main chain.

7. The lithographic printing plate precursor as claimed in claim 1, wherein the repeating unit having a structure represented by the formula (a1-1) in a side chain thereof is a repeating unit represented by the following formula (A1):

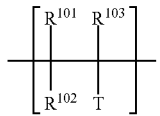

(A1)

wherein $R^{101}$ to $R^{103}$ each independently represents a hydrogen atom, an alkyl group having from 1 to 6 carbon atoms, or a halogen atom, and T represents the structure represented by the formula (a1-1).

8. The lithographic printing plate precursor as claimed in claim 1, wherein the divalent connecting group represented by $Y^2$ in the formulae (a2-1) and (a2-2) is a single bond, —CO—, a divalent aliphatic group, a divalent aromatic group, or one of the following L1 to L4:
L1: —CO—O-divalent aliphatic group-
L2: —CO—Co-divalent aromatic group-
L3: —CO—NH-divalent aliphatic group-
L4: —CO—NH-divalent aromatic group-.

9. The lithographic printing plate precursor as claimed in claim 1, wherein the repeating unit having a zwitter ion structure represented by the formula (a2-1) or (a2-2) in a side chain thereof is represented by the following formula (A2):

wherein $R^{201}$ to $R^{203}$ each independently represents a hydrogen atom, an alkyl group having from 1 to 6 carbon atoms, or a halogen atom, and G represents a side chain having a zwitter ion structure represented by the formula (a2-1) or (a2-2).

10. The lithographic printing plate precursor as claimed in claim 7, wherein the repeating unit represented by the formula (A1) is contained from 1 to 50% by mole based on total repeating unit constituting the polymer compound.

* * * * *